United States Patent
Mita et al.

(10) Patent No.: US 11,676,936 B2
(45) Date of Patent: Jun. 13, 2023

(54) MANUFACTURING METHOD FOR SEMICONDUCTOR DEVICE

(71) Applicant: NITTO DENKO CORPORATION, Ibaraki (JP)

(72) Inventors: Ryota Mita, Ibaraki (JP); Tomoaki Ichikawa, Ibaraki (JP)

(73) Assignee: NITTO DENKO CORPORATION, Ibaraki (JP)

( * ) Notice: Subject to any disclaimer, the term of this patent is extended or adjusted under 35 U.S.C. 154(b) by 112 days.

(21) Appl. No.: 17/050,113

(22) PCT Filed: Mar. 27, 2019

(86) PCT No.: PCT/JP2019/013138
§ 371 (c)(1),
(2) Date: Oct. 23, 2020

(87) PCT Pub. No.: WO2019/208071
PCT Pub. Date: Oct. 31, 2019

(65) Prior Publication Data
US 2021/0098418 A1   Apr. 1, 2021

(30) Foreign Application Priority Data

Apr. 27, 2018 (JP) ............... JP2018-086475
Sep. 10, 2018 (JP) ............... JP2018-168832

(51) Int. Cl.
*H01L 23/00* (2006.01)
*H01L 21/48* (2006.01)
(Continued)

(52) U.S. Cl.
CPC .......... *H01L 24/83* (2013.01); *H01L 21/4853* (2013.01); *H01L 21/565* (2013.01);
(Continued)

(58) Field of Classification Search
CPC ..... H01L 24/83; H01L 21/6836; H01L 21/78; H01L 24/29; H01L 2221/68336;
(Continued)

(56) References Cited

U.S. PATENT DOCUMENTS 8,071,465 B2    12/2011  Hatakeyama et al.
2010/0267199 A1 10/2010  Hatakeyama et al.
(Continued)

FOREIGN PATENT DOCUMENTS

DE   10 2006 033 073 B3   2/2008
JP       2008028347 A  *  2/2008  ............ B23K 26/38
(Continued)

OTHER PUBLICATIONS

International Search Report of PCT/JP2019/013138 dated May 21, 2019 [PCT/ISA/210].
(Continued)

*Primary Examiner* — Mohammad M Choudhry
(74) *Attorney, Agent, or Firm* — Sughrue Mion, PLLC

(57) ABSTRACT

A manufacturing method includes the step of forming a diced semiconductor wafer (10) including semiconductor chips (11) from a semiconductor wafer (W) typically on a dicing tape (T1). The diced semiconductor wafer (10) on the dicing tape (T1) is laminated with a sinter-bonding sheet (20). The semiconductor chips (11) each with a sinter-bonding material layer (21) derived from the sinter-bonding sheet (20) are picked up typically from the dicing tape (T1). The semiconductor chips (11) each with the sinter-bonding material layer are temporarily secured through the sinter-bonding material layer (21) to a substrate. Through a heating process, sintered layers are formed from the sinter-bonding material layers (21) lying between the temporarily secured semiconductor chips (11) and the substrate, to bond the semiconductor chips (11) to the substrate. The semiconduc-
(Continued)

tor device manufacturing method is suitable for efficiently supplying a sinter-bonding material to individual semiconductor chips while reducing loss of the sinter-bonding material.

18 Claims, 12 Drawing Sheets

(51) Int. Cl.
*H01L 21/56* (2006.01)
*H01L 21/683* (2006.01)
*H01L 21/78* (2006.01)

(52) U.S. Cl.
CPC .......... *H01L 21/6836* (2013.01); *H01L 21/78* (2013.01); *H01L 24/29* (2013.01); *H01L 24/32* (2013.01); *H01L 24/48* (2013.01); *H01L 24/73* (2013.01); *H01L 2221/68336* (2013.01); *H01L 2224/29239* (2013.01); *H01L 2224/29247* (2013.01); *H01L 2224/29286* (2013.01); *H01L 2224/32225* (2013.01); *H01L 2224/48225* (2013.01); *H01L 2224/73265* (2013.01); *H01L 2224/8384* (2013.01); *H01L 2924/01029* (2013.01); *H01L 2924/01047* (2013.01); *H01L 2924/0541* (2013.01); *H01L 2924/1033* (2013.01); *H01L 2924/10272* (2013.01)

(58) Field of Classification Search
CPC . H01L 2224/29239; H01L 2224/29247; H01L 2224/29286; H01L 2224/8384; H01L 2924/01029; H01L 2924/01047; H01L 2924/0541
See application file for complete search history.

(56) References Cited

U.S. PATENT DOCUMENTS

| | | |
|---|---|---|
| 2011/0318879 A1 | 12/2011 | Hatakeyama et al. |
| 2012/0037688 A1 | 2/2012 | Kock et al. |
| 2012/0114927 A1* | 5/2012 | Khaselev ................ H01L 24/27 |
| | | 156/247 |
| 2014/0057396 A1 | 2/2014 | Behrens et al. |
| 2014/0061909 A1 | 3/2014 | Speckels et al. |
| 2014/0131898 A1 | 5/2014 | Shearer et al. |
| 2016/0365323 A1 | 12/2016 | Viswanathan et al. |

FOREIGN PATENT DOCUMENTS

| | | |
|---|---|---|
| JP | 2011-119767 A | 6/2011 |
| JP | 2011-171688 A | 9/2011 |
| JP | 2011-253939 A | 12/2011 |
| JP | 2011-253940 A | 12/2011 |
| JP | 2013-039580 A | 2/2013 |
| JP | 6147176 B2 | 6/2017 |
| JP | 2017-147293 A | 8/2017 |
| JP | 2018-060850 A | 4/2018 |
| TW | 201202382 A | 1/2012 |
| TW | I473151 B | 2/2015 |
| WO | 2008/065728 A1 | 6/2008 |
| WO | 2015/192004 A1 | 12/2015 |
| WO | WO-2018116813 A1 * | 6/2018 ............ B32B 15/02 |

OTHER PUBLICATIONS

Partial Supplementary European Search Report dated Jan. 10, 2022 in European Application No. 19792041.6.

Office Action dated Aug. 30, 2022 issued by the Taiwanese Patent Office in Taiwanese Application No. 108113303.

* cited by examiner

MANUFACTURING METHOD FOR SEMICONDUCTOR DEVICE

CROSS REFERENCE TO RELATED APPLICATIONS

This application is a National Stage of International Application No. PCT/JP2019/013138, filed Mar. 27, 2019, claiming priorities to Japanese Patent Application No. 2018-086475, filed Apr. 27, 2018 and Japanese Patent Application No. 2018-168832, filed Sep. 10, 2018.

TECHNICAL FIELD

The present invention relates to methods for manufacturing semiconductor devices such as so-called power semiconductor devices.

BACKGROUND ART

In some semiconductor device productions, a semiconductor chip is die-bonded to a supporting substrate such as a lead frame or an insulated substrate (insulated circuit board) while establishing and keeping electrical connection with the supporting substrate. Known examples of this technique include a technique of forming a Au—Si eutectic alloy layer between the supporting substrate and the chip to actually provide a bonding state; and a technique of using a bonding material such as solder, or a resin containing conductive particles.

Power semiconductor devices, which assume power supply and control, have become remarkably widespread. Many of such power semiconductor devices output large heat due to the passage of large current during operation. The power semiconductor device productions therefore require a technique that can actually provide a highly reliable bonding state even in a high-temperature operation, in die-bonding of a semiconductor chip onto a supporting substrate while allowing the semiconductor chip to establish and keep electrical connection with the supporting substrate. In particular, this is significantly demanded by power semiconductor devices that employ SiC or GaN as a semiconductor material and are to operate at high temperatures. To meet the requirement with electrical connection, a proposed die bonding technique employs a material for sinter bonding (sinter-bonding material) containing, for example, sinterable particles and a solvent (vehicle).

In such die bonding using a sinter-bonding material containing sinterable particles, initially, a semiconductor chip is placed on a predetermined chip-mounting area of a supporting substrate, through the sinter-bonding material under predetermined temperature-load conditions. Then, between the supporting substrate and the semiconductor chip over the supporting substrate, a heating process operates under predetermined temperature-pressurization conditions so that the solvent in the sinter-bonding material undergoes, for example, volatilization and the sintering proceeds between the sinterable particles. This forms a sintered layer between the supporting substrate and the semiconductor chip and allows the semiconductor chip to electrically connect with, and mechanically bond to, the supporting substrate. The technique as above is taught typically by Patent Literature (PTL) 1 and PTL 2 as follows.

CITATION LIST

Patent Literature

PTL 1: PCT International Publication Number WO2008/065728

PTL 2: Japanese Unexamined Patent Application Publication (JP-A) No. 2013-039580

SUMMARY OF INVENTION

Technical Problem

In such a semiconductor device manufacture process including die bonding through sinter bonding, for example, the following process is proposed to supply a sinter-bonding material to semiconductor chips batchwise (by one operation). Initially, semiconductor chips are arrayed on a processing tape having an adhesive face on one side thereof, or on the adhesive face. Next, a sheet including a plastic layer and a sinter-bonding material layer on the plastic layer is prepared and laminated onto the semiconductor chip array on the processing tape through compression bonding, so that the material layer faces the semiconductor chip array. Next, the sheet is removed while portions of the sinter-bonding material layer remain on the semiconductor chips, which portions are compressed and bonded to the semiconductor chips. The lamination and subsequent removal of the sheet causes transfer of the sinter-bonding material to each semiconductor chip. The technique as above enables supply of a sinter-bonding material to multiple semiconductor chips by batch. Such technique, however, causes relatively large loss of the sinter-bonding material. The reasons are as follows.

The arrangement of semiconductor chips on the processing tape is performed typically while keeping a sufficient separation distance between adjacent chips, to avoid contact between the chips during the arrangement operation, where the contact may possibly cause chipping of the chips. The separation distance is about 800 to about 2000 μm. Namely, there is a significant clearance between the semiconductor chips in the semiconductor chip array on the processing tape after the arrangement operation. Accordingly, of the sheet for sinter-bonding material supply, areas or portions (a part of the sinter-bonding material layer) of the sinter-bonding material layer are transferred to the semiconductor chips, where the areas or portions are compressed and bonded to the individual semiconductor chips in lamination of the sheet onto the semiconductor chip array. In the lamination, other portions of the sinter-bonding material layer, which face the clearance between semiconductor chips, are not transferred to the semiconductor chips. The portions of the sinter-bonding material layer which are not transferred to the semiconductor chips become loses. The loses tend to increase with an increasing clearance between the semiconductor chips.

The present invention has been made under these circumstances and has an object to provide a manufacturing method for a semiconductor device including semiconductor chips at sinter-bonded areas, which method is suitable for efficiently supplying a sinter-bonding material to each semiconductor chip while reducing the loss of the sinter-bonding material.

Solution to Problem

The present invention provides, in a first aspect, a semiconductor device manufacturing method that includes a dicing step, a lamination step, a picking-up step, a temporary securing step, and a sinter bonding step as follows. This method is suitable for manufacturing a power semiconductor device or another semiconductor device that includes semiconductor chips in sinter-bonded areas.

In the dicing step, a diced semiconductor wafer including semiconductor chips is formed from a semiconductor wafer being held on a dicing tape. In the step, the diced semiconductor wafer can be formed by blade dicing of the semiconductor wafer (first technique). In another embodiment, in the step, the diced semiconductor wafer can be formed by stealth-dicing the semiconductor wafer being held on the dicing tape, and subsequently temporarily expanding the dicing tape which holds the semiconductor wafer, to cleave the semiconductor wafer (second technique). The stealth dicing forms embrittled regions in the semiconductor wafer, where the embrittled regions will serve to cleave the wafer into semiconductor chips. The semiconductor wafer undergone the stealth dicing is in such a state as to be cleaved along the embrittled regions by expanding the dicing tape which holds the wafer. The diced semiconductor wafer formed through one of the first technique and the second technique has a spacing between chips (spacing between adjacent chips) of about 10 to about 500 µm.

In the lamination step, a sinter-bonding sheet is laminated onto the diced semiconductor wafer on the dicing tape so that the sinter-bonding sheet exists opposite to the dicing tape, where the sinter-bonding sheet includes conductive metal-containing sinterable particles and a binder component. This causes compression bonding and transfer of a sinter-bonding material derived from the sinter-bonding sheet to each of the semiconductor chips.

In the picking-up step, each semiconductor chip is picked up together with a sinter-bonding material layer adhering to the chip, to give semiconductor chips each with the sinter-bonding material layer. In the picking-up step, the semiconductor chips each with the sinter-bonding material layer are picked up, for example, from the dicing tape. In another embodiment, the method may include, between the lamination step and the picking-up step, the step of laminating a wafer processing tape onto the sinter-bonding sheet in the diced semiconductor wafer bearing the sinter-bonding sheet, and removing the dicing tape from the diced semiconductor wafer. In this embodiment, in the picking-up step, the semiconductor chips each with the sinter-bonding material layer are picked up from the wafer processing tape.

In the temporary securing step, the semiconductor chips each with the sinter-bonding material layer are compression-bonded to, and temporarily secured to, a substrate through the sinter-bonding material layer.

In the sinter bonding step, the work receives a heating process, to form sintered layers from the sinter-bonding material layers lying between the semiconductor chips and the substrate which are temporarily secured to each other. This allows the semiconductor chips to sinter-bond to the substrate.

The semiconductor device manufacturing method according to the aspect performs the lamination step so as to laminate the sinter-bonding sheet for supplying the sinter-bonding material onto the diced semiconductor wafer (including singularized or diced semiconductor chips) on the dicing tape, as described above. The configuration as above is suitable for efficient batchwise supply of the sinter-bonding material to each of the semiconductor chips, namely, for efficient batchwise transfer and formation of a sinter-bonding material layer onto each of the semiconductor chips.

In addition, the semiconductor device manufacturing method according to the aspect performs the dicing step so as to form the diced semiconductor wafer on the dicing tape (namely, a semiconductor wafer which has undergone singularization (dicing) into chips while being held on the dicing tape) that has a short spacing between chips of about 10 to about 500 µm, as described above. In the lamination step, the sinter-bonding sheet is laminated onto the diced semiconductor wafer as above (the sinter-bonding sheet is not laminated onto semiconductor chips with relatively large clearance between the chips, where the semiconductor chips undergo singularization (dicing) from a semiconductor wafer and are then arranged on a processing tape). Consequently, the semiconductor device manufacturing method according to the aspect is suitable for reducing loss of a sinter-bonding material upon batchwise supply of the sinter-bonding material to each of the semiconductor chips.

As described above, the semiconductor device manufacturing method according to the first aspect of the present invention is suitable for efficiently supplying a sinter-bonding material to each of semiconductor chips while reducing loss of the sinter-bonding material.

The method preferably further includes, between the dicing step and the lamination step, the step of temporarily expanding the dicing tape which holds the diced semiconductor wafer. The configuration as above is preferred for picking up each semiconductor chip appropriately in the picking-up step.

The method preferably further includes, between the lamination step and the picking-up step, the step of temporarily expanding the dicing tape which holds the diced semiconductor wafer. The configuration as above is preferred for cleaving the sinter-bonding sheet before the picking-up step and picking up each semiconductor chip appropriately in the picking-up step. In an embodiment, the method may further include, between the expanding step as above and the picking-up step, the step of laminating a wafer processing tape onto the sinter-bonding material layer adhering to each of the semiconductor chips in the diced semiconductor wafer, where the sinter-bonding material layer is derived from the sinter-bonding sheet, and removing the dicing tape from the diced semiconductor wafer. In this embodiment, the picking-up step picks up the semiconductor chips each with the sinter-bonding material layer from the wafer processing tape.

The present invention provides, in a second aspect, a semiconductor device manufacturing method that includes a stealth dicing step, a lamination step, a cleaving step, a picking-up step, a temporary securing step, and a sinter bonding step as follows. In the stealth dicing step, embrittled regions are formed in a semiconductor wafer being held on a dicing tape, where the embrittled regions will serve to cleave the wafer into semiconductor chips. In the lamination step, a sinter-bonding sheet is laminated onto the semiconductor wafer on the dicing tape so that the sinter-bonding sheet exists opposite to the dicing tape. The sinter-bonding sheet includes conductive metal-containing sinterable particles and a binder component. In the cleaving step, the dicing tape which holds the semiconductor wafer is expanded to cleave the semiconductor wafer together with the sinter-bonding sheet. This forms a diced semiconductor wafer including semiconductor chips each adhering to a sinter-bonding material layer derived from the sinter-bonding sheet. In the picking-up step, the semiconductor chips each with the sinter-bonding material layer are picked up from the dicing tape. In another embodiment, the method may further include, between the cleaving step and the picking-up step, the step of laminating a wafer processing tape onto the sinter-bonding material layer adhering to the semiconductor chips in the diced semiconductor wafer, where the sinter-bonding material layer is derived from the sinter-bonding sheet, and removing the dicing tape from the diced semiconductor wafer; and, in the picking-up step in this embodiment, the semiconductor chips each with the sinter-bonding material layer are picked up from the wafer processing tape. In the temporary securing step, the semiconductor chips each with the sinter-bonding material layer are temporarily secured through the sinter-bonding material layer to a substrate. In the sinter bonding step, the sinter-bonding material layers lying between the temporarily secured semiconductor chips and the substrate undergo a heating process, to convert into sintered layers, to thereby sinter-bond the semiconductor chips to the substrate.

The semiconductor device manufacturing method according to the second aspect of the present invention performs the lamination step so as to laminate the sinter-bonding sheet onto the semiconductor wafer after stealth dicing on the dicing tape, where the sinter-bonding sheet serves to supply the sinter-bonding material, as described above. The configuration as above is suitable for efficient batchwise supply of the sinter-bonding material to individual portions of the semiconductor wafer which will be singularized (diced) into semiconductor chips, namely, suitable for efficient batchwise transfer and formation of the sinter-bonding material layer onto individual portions of the semiconductor wafer which will be singularized into semiconductor chips.

In addition, the semiconductor device manufacturing method according to the second aspect of the present invention performs the lamination step so as to laminate the sinter-bonding sheet onto a semiconductor wafer that has not undergone the singularization into chips (namely, a semiconductor wafer without chip-to-chip clearance). The lamination step as above enables compression bonding of the sinter-bonding sheet for supply of the sinter-bonding material to the wafer in entire regions to be laminated onto the semiconductor wafer. Consequently, the semiconductor device manufacturing method according to the aspect is suitable for reducing loss of the sinter-bonding material to be fed to semiconductor chips obtained in the process.

As described above, the semiconductor device manufacturing method according to the second aspect of the present invention is suitable for efficiently supplying the sinter-bonding material to individual semiconductor chips while reducing loss of the sinter-bonding material.

The present invention also provides, in a third aspect, a semiconductor device manufacturing method that includes a lamination step, a singularization step, a picking-up step, a temporary securing step, and a sinter bonding step, as follows. In the lamination step, a sinter-bonding sheet is laminated onto a semiconductor wafer being held on a dicing tape so that the sinter-bonding sheet exists opposite to the dicing tape. The sinter-bonding sheet includes conductive metal-containing sinterable particles and a binder component. In the singularization step, the semiconductor wafer on the dicing tape is singularized (or diced) together with the sinter-bonding sheet, to form a diced semiconductor wafer including semiconductor chips each adhering to a sinter-bonding material layer derived from the sinter-bonding sheet. In the singularization step, the diced semiconductor wafer can be formed by blade dicing of the semiconductor wafer and the overlying sinter-bonding sheet. In another embodiment, the diced semiconductor wafer can be formed in the singularization step by forming embrittle regions in the semiconductor wafer being held on the dicing tape, where the embrittled regions will serve to cleave the wafer into semiconductor chips, and subsequently expanding the dicing tape which holds the semiconductor wafer to cleave the semiconductor wafer and the overlying sinter-bonding sheet. In the picking-up step, the semiconductor chips are picked up together with the sinter-bonding material layer adhering to each of the chips, to give semiconductor chips each with the sinter-bonding material layer. This picking-up step operates to pick up the semiconductor chips each with the sinter-bonding material layer from the dicing tape. In another embodiment, the method further includes, between the singularization step and the picking-up step, the step of laminating a wafer processing tape onto the sinter-bonding material layer adhering to the semiconductor chips in the diced semiconductor wafer, where the sinter-bonding material layer is derived from the sinter-bonding sheet, and removing the dicing tape from the diced semiconductor wafer. In this embodiment, in the picking-up step, the semiconductor chips each with the sinter-bonding material layer are picked up from the wafer processing tape. In the temporary securing step, the semiconductor chips each with the sinter-bonding material layer are temporarily bond through the sinter-bonding material layer to a substrate. In the sinter bonding step, the sinter-bonding material layers lying between the temporarily secured semiconductor chips and the substrate undergo a heating process to convert into sintered layers. This allows the semiconductor chips to sinter-bond to the substrate.

The semiconductor device manufacturing method according to the third aspect of the present invention performs the lamination step so as to laminate the sinter-bonding sheet onto the semiconductor wafer on the dicing tape, where the sinter-bonding sheet serves to supply the sinter-bonding material, as described above. The configuration as above is suitable for efficient batchwise supply of the sinter-bonding material to individual portions of the semiconductor wafer to be singularized into semiconductor chips, namely, for efficient batchwise transfer and formation of the sinter-bonding material layer onto individual portions of the semiconductor wafer to be singularized into semiconductor chips.

In addition, the semiconductor device manufacturing method according to the third aspect of the present invention performs the lamination step so as to laminate the sinter-bonding sheet onto the semiconductor wafer, which has not undergone singularization into chips (namely, semiconductor wafer without chip-to-chip clearance). The lamination step as above allows the sinter-bonding sheet to be compression-bonded to the semiconductor wafer in entire regions to be laminated onto the wafer, where the sinter-bonding sheet serves to supply the sinter-bonding material. Consequently, the semiconductor device manufacturing method is suitable for reducing loss of the sinter-bonding material to be supplied to semiconductor chips obtained in the process.

As described above, the semiconductor device manufacturing method according to the third aspect of the present invention is suitable for efficiently supplying a sinter-bonding material to individual semiconductor chips while reducing loss of the sinter-bonding material.

The sintered layers formed in the sinter bonding step according to the first, second, and third aspects of the present invention each have a thickness in the range of preferably from 60% to 140%, more preferably from 80% to 120%, and still more preferably from 90% to 110%, of the average thickness of the sintered layers. With increasing uniformity in the thicknesses of the sintered layers, the sintered layers more tend to have high bonding reliability. The sintered layers formed in the sinter bonding step have an average thickness of preferably 5 to 200 μm, and more preferably 10 to 150 μm. The configuration as above is preferred for relaxing internal stress in the sintered layers due to heat stress, to surely provide sufficient thermal shock reliability, and for reducing not only sinter bonding cost, but also semiconductor device manufacturing cost.

The sinterable particles in the sinter-bonding sheet for use in the first, second, and third aspects of the present invention preferably include at least one selected from the group consisting of silver, copper, silver oxide, and copper oxide. The configuration as above is advantageous for the formation of firm or strong sintered layers between a substrate and semiconductor chips which are sinter-bonded to each other. The binder component in the sinter-bonding sheet is preferably a thermally decomposable polymer binder.

DESCRIPTION OF EMBODIMENTS

FIGS. 1(a) to 4(b) illustrate a semiconductor device manufacturing method according to one embodiment of the present invention. The semiconductor device manufacturing method according to the embodiment is a method for manufacturing a power semiconductor device or another semiconductor device including semiconductor chips in sinter-bonded areas. The method includes a dicing step, a lamination step, a picking-up step, a temporary securing step, and a sinter bonding step as follows.

Figure 1A:
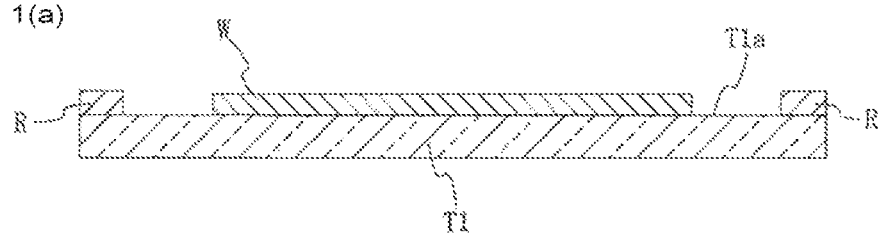
FIGS. 1(a)-1(d) illustrates some steps in a semiconductor device manufacturing method according to one embodiment of the present invention.
Figure 1B:
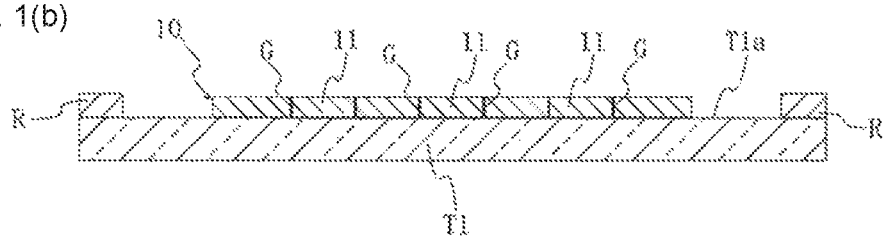

In the dicing step, a semiconductor wafer W, which is held on a dicing tape T1, receives blade dicing to form a diced semiconductor wafer 10, as illustrated in FIGS. 1(a) and 1(b).

The dicing tape T1 typically has a multilayer structure including a substrate (carrier) and a pressure-sensitive adhesive layer and has an adhesive face T1a, which is defined by the pressure-sensitive adhesive layer, on one side. The semiconductor wafer W has an element-formed side on which semiconductor elements are built, and a backside opposite to the element-formed side. The backside bears plane electrodes (not shown) as external electrodes. Non-limiting examples of a material to constitute the wafer body of the semiconductor wafer W include silicon carbide (SiC), gallium nitride (GaN), and other semiconductor materials for power semiconductor devices. The semiconductor wafer W has a thickness of typically 20 to 1000 μm.

Specifically in the step, initially, the adhesive face T1a of the dicing tape T1 adheres to the element-formed side (the lower side in the figure) of the semiconductor wafer W. A ring frame R is applied to the periphery of the adhesive face T1a of the dicing tape T1. The ring frame R is a member with which a conveying mechanism, such as a conveying arm, of a dicer (dicing saw) (not shown) is in contact upon conveying of the work, while the ring frame R is adhering to the dicing tape T1.

In the step, next, a rotary blade (not shown) of a dicer is driven while the semiconductor wafer W is held on the adhesive face T1a of the dicing tape T1. Thus, cutting of the semiconductor wafer W proceeds. The cutting proceeds along intended cutting lines while running water is continuously fed toward the rotary blade and the semiconductor wafer W. In FIG. 1(b), cutting grooves G formed using the dicing rotary blade are schematically indicated by thick lines. The cutting grooves G may reach the inside of the dicing tape T1. Through the dicing step as above, dicing (singularization) of the semiconductor wafer W into chips operates, to form a diced semiconductor wafer 10 including semiconductor chips 11, on the dicing tape T1. The diced semiconductor wafer 10 formed by the above procedure has a spacing between the semiconductor chips 11 of typically 10 to 500 μm.

Figure 1C:
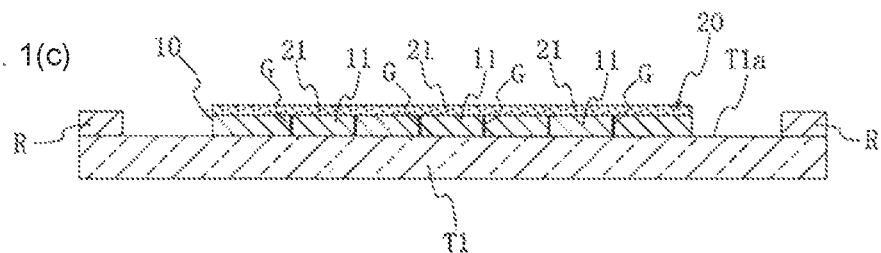
Figure 1D:
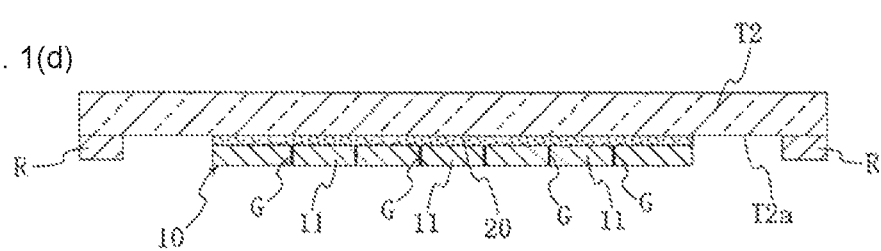

In the embodiment, next, the diced semiconductor wafer 10 is laminated with a sinter-bonding sheet 20 (lamination step), as illustrated in FIG. 1(c). The sinter-bonding sheet 20 is a sheet of a composition including a binder component and sinterable particles containing a conductive metal. The sheet is laminated onto the surface or the backside of the diced semiconductor wafer 10 on the dicing tape T1, so that the sheet exists opposite to the dicing tape T1. A non-limiting example of the pressing means for lamination is a pressure roller. The lamination operates at a temperature of typically from room temperature to 200° C. under a load of typically 0.01 to 10 MPa. The step enables batchwise transfer of the sinter-bonding material layer 21 to each of the semiconductor chips 11 in the diced semiconductor wafer 10, by compression bonding of the sinter-bonding material derived from the sinter-bonding sheet 20.

The sinter-bonding sheet 20 is used for sinter bonding between targets to be bonded, and is a sheet of a composition including a binder component and sinterable particles containing a conductive metal, as described above.

The sinterable particles in the sinter-bonding sheet 20 are particles that contain a conductive metal element and are sinterable. Non-limiting examples of the conductive metal element include gold, silver, copper, palladium, tin, and nickel. Non-limiting examples of a material to constitute the sinterable particles as above include gold, silver, copper, palladium, tin, and nickel; and alloys of two or more different metals selected from the group consisting of these metals. Non-limiting examples of a material to constitute the sinterable particles also include metal oxides such as silver oxide, copper oxide, palladium oxide, and tin oxide. The sinterable particles may also be particles having a core-shell structure. For example, the sinterable particles may be core-shell structure particles, which include a core mainly containing copper, and a shell mainly containing, for example, gold or silver and covering the core. In the embodiment, the sinterable particles preferably include at least one selected from the group consisting of silver particles, copper particles, silver oxide particles, and copper oxide particles. The sinterable particles are preferably selected from silver particles and copper particles, from the viewpoint of actually providing high electric conductivity and high thermal conductivity in the formed sintered layers. In addition, silver particles are easily handleable and are preferred from the viewpoint of oxidation resistance. For example, assume that a sintering process operates in sinter bonding of semiconductor chips to a silver-plated copper substrate, using a sintering material including copper particles as the sinterable particles. This sintering process has to be performed in an inert environment such as a nitrogen atmosphere. However, a sintering process in sinter bonding using a sintering material including silver particles as the sinterable particles can operate appropriately even in an air atmosphere.

The sinterable particles for use herein have an average particle diameter (average particle size) of preferably 2000 nm or less, more preferably 800 nm or less, and still more preferably 500 nm or less, from the viewpoint typically of actually providing a low sintering temperature of the sinterable particles, to surely provide satisfactory sinterability. The sinterable particles have an average particle diameter of preferably 1 nm or more, more preferably 10 nm or more, still more preferably 50 nm or more, and still more preferably 100 nm or more, from the viewpoint of allowing the sinterable particles to be satisfactorily dispersible in the sinter-bonding sheet 20 or in the composition to form the sheet 10. The average particle diameter of the sinterable particles can be measured by observation using a scanning electron microscope (SEM).

The sinter-bonding sheet 20 contains the sinterable particles in a proportion of preferably 60 to 99 mass percent, more preferably 65 to 98 mass percent, still more preferably 70 to 97 mass percent, and still more preferably 70 to 95 mass percent, from the viewpoint of actually providing highly reliable sinter bonding.

In the embodiment, the binder component in the sinter-bonding sheet 20 includes a thermally decomposable polymer binder and a low-boiling binder and may further include one or more other components such as a plasticizer. The thermally decomposable polymer binder is a binder component that is decomposable in a high-temperature heating process for sinter bonding, and is an element that contributes to a retained sheet form of the sinter-bonding sheet 20 before the heating process. In the embodiment, the thermally decomposable polymer binder is a material that is solid at normal temperature (23° C.), from the viewpoint of surely providing sheet form retainability. Non-limiting examples of such thermally decomposable polymer binders include polycarbonate resins and acrylic resins.

Examples of the polycarbonate resins for use as the thermally decomposable polymer binder include aliphatic polycarbonates whose backbone is composed of an aliphatic chain and does not include, between carbonic acid ester groups (—O—CO—O—) in the backbone, benzene rings and other moieties derived from aromatic compounds; and aromatic polycarbonates which include a moiety derived from an aromatic compound between carbonic acid ester groups (—O—CO—O—) in the backbone. Non-limiting examples of the aliphatic polycarbonates include poly(ethylene carbonate)s and poly(propylene carbonate)s. Non-limiting examples of the aromatic polycarbonates include polycarbonates including a bisphenol-A structure in the backbone.

Examples of the acrylic resins for use as the thermally decomposable polymer binder include polymers of an acrylic ester and/or a methacrylic ester each having $C_4$-$C_{18}$ linear or branched alkyl. Hereinafter the term "(meth) acrylic" indicates "acrylic" and/or "methacrylic"; and the term "(meth)acrylate" indicates "acrylate" and/or "methacrylate". Non-limiting examples of the alkyl moiety of the (meth)acrylic ester to form the acrylic resin as the thermally decomposable polymer binder include methyl, ethyl, propyl, isopropyl, n-butyl, t-butyl, isobutyl, amyl, isoamyl, hexyl, heptyl, cyclohexyl, 2-ethylhexyl, octyl, isooctyl, nonyl, isononyl, decyl, isodecyl, undecyl, lauryl, tridecyl, tetradecyl, stearyl, and octadecyl.

The acrylic resin as the thermally decomposable polymer binder may also be a polymer further including a monomer unit derived from a monomer other than the (meth)acrylic esters. Examples of such other monomers include carboxy-containing monomers, acid anhydride monomers, hydroxy-containing monomers, sulfo-containing monomers, and phosphate-containing monomers. Specifically, non-limiting examples of the carboxy-containing monomers include acrylic acid, methacrylic acid, carboxyethyl acrylate, carboxypentyl acrylate, itaconic acid, maleic acid, fumaric acid, and crotonic acid. Examples of the acid anhydride monomers include, but are not limited to, maleic anhydride and itaconic anhydride. Non-limiting examples of the hydroxy-containing monomers include 2-hydroxyethyl (meth)acrylate, 2-hydroxypropyl (meth) acrylate, 4-hydroxybutyl (meth)acrylate, 6-hydroxyhexyl (meth)acrylate, 8-hydroxyoctyl (meth)acrylate, 10-hydroxydecyl (meth)acrylate, 12-hydroxylauryl (meth)acrylate, and 4-(hydroxymethyl) cyclohexylmethyl (meth) acrylate. Non-limiting examples of the sulfo-containing monomers include styrenesulfonic acid, allylsulfonic acid, 2-(meth)acrylamido-2-methylpropanesulfonic acid, (meth) acrylamidopropanesulfonic acid, sulfopropyl (meth)acrylate, and (meth)acryloyloxynaphthalenesulfonic acid. A non-limiting example of the phosphate-containing monomers is 2-hydroxyethylacryloyl phosphate.

The thermally decomposable polymer binder has a weight-average molecular weight of preferably 10000 or more. The "weight-average molecular weight" of the thermally decomposable polymer binder herein refers to a value measured by gel permeation chromatography (GPC) and calibrated with a polystyrene standard.

The sinter-bonding sheet 20 may contain the thermally decomposable polymer binder in a proportion of preferably 0.5 to 10 mass percent, more preferably 0.8 to 8 mass percent, and still more preferably 1 to 6 mass percent, from the viewpoint of appropriately exhibiting the function of sheet form retaining.

The "low-boiling binder" in the sinter-bonding sheet 20 refers to a binder that has a viscosity of $1 \times 10^5$ Pa·s or less and is liquid or semi-liquid at 23° C., where the viscosity is measured using a dynamic viscoelastometer (trade name HAAKE MARS III, supplied by Thermo Fisher Scientfic). The viscosity measurement operates using 20-mm diameter parallel plates as fixtures at a plate-to-plate gap of 100 μm and a shear rate in rotary shearing of $1$ $s^{-1}$.

Non-limiting examples of the low-boiling binder include terpene alcohols, alcohols other than terpene alcohols, alkylene glycol alkyl ethers, and ethers other than alkylene glycol alkyl ethers. Non-limiting examples of the terpene alcohols include isobornylcyclohexanol, citronellol, geraniol, nerol, carveol, and α-terpineol. Non-limiting examples of the alcohols other than terpene alcohols include pentanol, hexanol, heptanol, octanol, 1-decanol, ethylene glycol, diethylene glycol, propylene glycol, butylene glycol, and 2,4-diethyl-1,5-pentanediol. Examples of the alkylene glycol alkyl ethers include ethylene glycol butyl ether, diethylene glycol methyl ether, diethylene glycol ethyl ether, diethylene glycol butyl ether, diethylene glycol isobutyl ether, diethylene glycol hexyl ether, diethylene glycol dimethyl ether, diethylene glycol diethyl ether, diethylene glycol dibutyl ether, diethylene glycol butyl methyl ether, diethylene glycol isopropyl methyl ether, triethylene glycol methyl ether, triethylene glycol dimethyl ether, triethylene glycol butyl methyl ether, propylene glycol propyl ether, dipropylene glycol methyl ether, dipropylene glycol ethyl ether, dipropylene glycol propyl ether, dipropylene glycol butyl ether, dipropylene glycol dimethyl ether, tripropylene glycol methyl ether, and tripropylene glycol dimethyl ether. Non-limiting examples of the ethers other than alkylene glycol alkyl ethers include ethylene glycol ethyl ether acetate, ethylene glycol butyl ether acetate, diethylene glycol ethyl ether acetate, diethylene glycol butyl ether acetate, and dipropylene glycol methyl ether acetate. The sinter-bonding sheet 20 may include each of different low-boiling binders alone or in combination. The low-boiling binder(s) in the sinter-bonding sheet 20 is preferably selected from terpene alcohols and is more preferably isobornylcyclohexanol, from the viewpoint of providing stability at normal temperature (room temperature).

The sinter-bonding sheet 20 has a thickness at 23° C. of preferably 5 μm or more, more preferably 10 μm or more, and preferably 300 μm or less, and more preferably 150 μm or less. The sinter-bonding sheet 20 or the sinter-bonding composition to form the sheet 20 has a viscosity at 70° C. of typically $5 \times 10^3$ to $1 \times 10^7$ Pa·s, and preferably $1 \times 10^4$ to $1 \times 10^6$ Pa·s.

The sinter-bonding sheet 20 can be prepared typically by blending the components in a solvent (vehicle) to give a varnish, applying the varnish onto a separator serving as a carrier or substrate, to form a coating, and drying the coating. Non-limiting examples of the solvent usable for the preparation of the varnish include organic solvents and alcohol solvents.

After the lamination step, the method according to the embodiment performs a reversing step as illustrated in FIG. 1(*d*). Specifically, in the step, a wafer processing tape T2 having an adhesive face T2a adheres to the work, and the dicing tape T1 is removed from the work, where the work is the diced semiconductor wafer 10 with the sinter-bonding sheet 20. The adhesive face T2a of the wafer processing tape T2 has an adhesive strength equal to or greater than the adhesive strength of the adhesive face T1a of the processing tape T1. In the step, for example, the adhesive face T2a of the wafer processing tape T2 adheres to the sinter-bonding sheet 20 in the diced semiconductor wafer 10 with the sinter-bonding sheet 20, and then the dicing tape T1 is removed from the diced semiconductor wafer 10.

Figure 2:
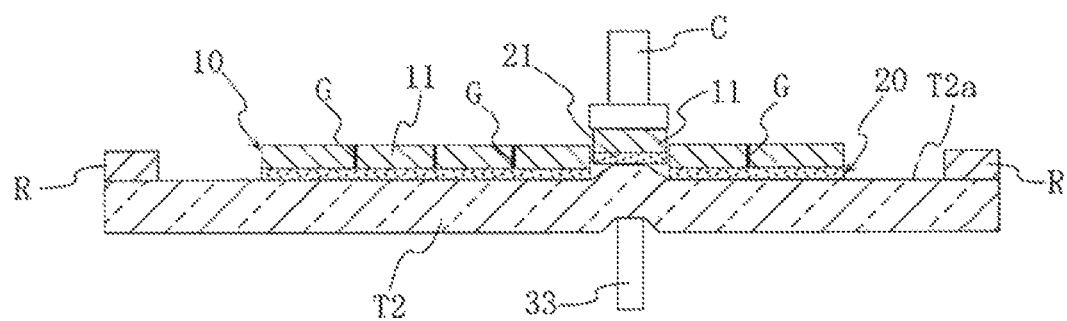
FIG. 2 illustrates a step subsequent to the steps illustrated in FIGS. 1(a)-1(d)
Figure 3A:
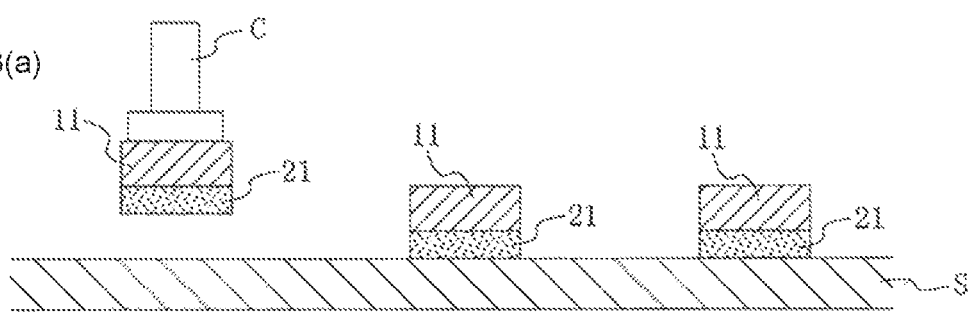
FIGS. 3(a)-3(b) illustrates steps subsequent to the step illustrated in FIG. 2.
Figure 3B:
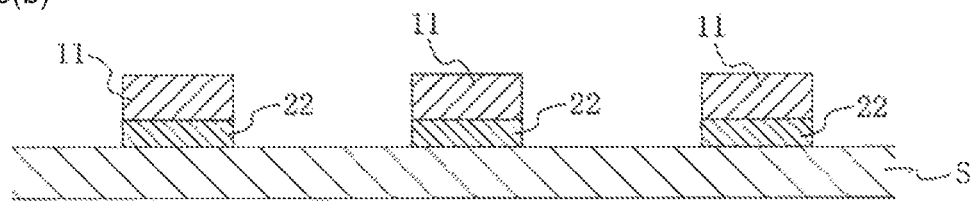

In the semiconductor device manufacturing method according to the embodiment, next, each of the semiconductor chips 11 together with the sinter-bonding material layer 21 adhering tightly to each chip is picked up from the wafer processing tape T2 to give a sinter-bonding material layer-associated semiconductor chip 11 (picking-up step), as illustrated in FIG. 2. Specifically, in the step, a target sinter-bonding material layer-associated semiconductor chip 11 to be picked up is plunged up through the wafer processing tape T2 by elevating a pin lifter 33 of a picking-up mechanism from below the wafer processing tape T2 in the figure, and the semiconductor chip 11 is sucked and held by a suction collet C. The sinter-bonding material layer-associated semiconductor chips 11 can be picked up using the sucking-holding action of the suction collet C as above. This is also applied to the after-mentioned picking-up step.

Next, each sinter-bonding material layer-associated semiconductor chip 11 is temporarily secured, by compression bonding, through the sinter-bonding material layer 21 to a supporting substrate S (temporary securing step), as illustrated in FIG. 3(*a*). Specifically, each sinter-bonding material layer-associated semiconductor chip 11 is pressed and thereby temporarily secured through the sinter-bonding material layer 21 to the supporting substrate S, typically using a chip mounter. Non-limiting examples of the supporting substrate S include lead frames; and insulated substrates with wiring such as copper wiring. On the supporting substrate S, the chip may be mounted on the base material (matrix) such as a copper wiring or lead frame, or may be mounted on a plated film disposed on the base material. Non-limiting examples of the plated film include gold-plated films, silver-plated films, nickel-plated films, palladium-plated films, and platinum-plated films. In the step, the temporary securing operates at a temperature of typically from room temperature to 300° C. by pressing under a load of typically 0.01 to 50 MPa for a bonding time of typically 0.01 to 300 seconds.

Next, with reference to FIG. 3(*b*), the work receives a heating process to allow the sinter-bonding material layers 21 to convert into sintered layers 22, where the sinter-bonding material layers 22 lie between the semiconductor chips 11 and the supporting substrate S, which are temporarily secured to each other. This allows the semiconductor chips 11 to be sinter-bonded to the supporting substrate S (sinter bonding step). Specifically, the work undergoes a predetermined high-temperature heating process, and this causes, in the sinter-bonding material layers 21 lying between the supporting substrate S and the semiconductor chips 11, the low-boiling binder to volatilize, causes the thermally decomposable polymer binder to thermally decompose and volatilize, and causes the conductive metal in the sinterable particles to sinter. This forms the sintered layers 22 between the supporting substrate S and the semiconductor chips 11 and allows the semiconductor chips 11 to bond to the supporting substrate S while establishing and keeping electrical connection with the supporting substrate S. The sinter bonding in the step operates at a temperature of typically from 150° C. to 400° C., and preferably from 250° C. to 350° C., at a pressure of typically 60 MPa or less, and preferably 40 MPa or less, for a bonding time of typically 0.3 to 300 minutes, and preferably 0.5 to 240 minutes. Typically within these condition ranges, the temperature profile and the pressure profile for performing the sinter bonding step are appropriately determined. The sinter bonding step as above can operate using an apparatus that perform heating and pressurization simultaneously. Non-limiting examples of such an apparatus include flip-chip bonders and parallel plate pressing machines. The step is preferably performed in a nitrogen atmosphere, or under reduced pressure, or in a reducing gas atmosphere, to prevent or minimize oxidation of the metal or metals involved in sinter bonding.

In the embodiment, the sintered layers 22 formed in the sinter bonding step each have a thickness in the range of preferably from 60% to 140%, more preferably from 80% to 120%, and still more preferably from 90% to 110%, of the average thickness of the sintered layer 22. With increasing uniformity in thicknesses of the sintered layers 22, the sintered layers 22 can more readily have high bonding reliability. The sintered layers 22 have an average thickness of preferably 5 to 200 μm, and more preferably 10 to 150 μm. This configuration is preferred for relaxing the internal stress in the sintered layers 22 caused by heat stress, to surely have sufficient thermal-shock reliability and for reducing not only the sinter bonding cost, but also the semiconductor device production cost.

Figure 4A:
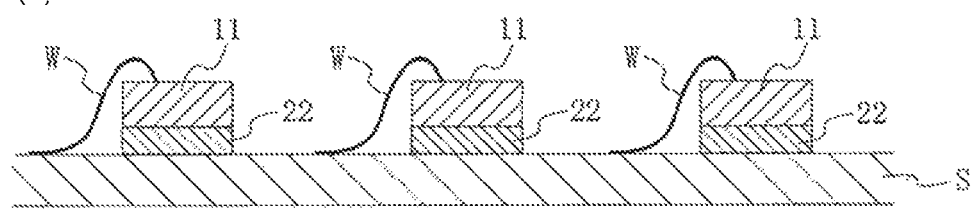
FIGS. 4(a)-4(b) illustrates steps subsequent to the steps illustrated in FIGS. 3(a)-3(b)

The semiconductor device manufacturing method according to the embodiment then performs a wire bonding step. In the step, a terminal area (not shown) of each semiconductor chip 11 and a terminal area (not shown) of the supporting substrate S are electrically connected (coupled) to each other, where necessary via a bonding wire W, as illustrated in FIG. 4(a). The connection between the bonding wire W and the terminal area of the semiconductor chip 11 or the terminal area of the supporting substrate S is provided typically through ultrasonic welding with heating. Non-limiting examples of the bonding wire W usable herein include gold wires, aluminum wires, and copper wires. The wire bonding operates at a wire heating temperature of typically 80° C. to 250° C., and preferably 80° C. to 220° C., for a heating time of from several seconds to several minutes.

Figure 4B:
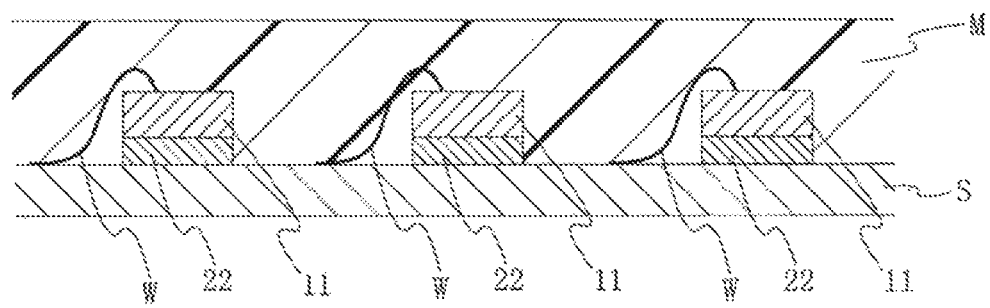

Next, a resinous encapsulant M is formed to protect the semiconductor chips 11 and the bonding wires W on the substrate S (encapsulation step), as illustrated in FIG. 4(b). In this step, the resinous encapsulant M is disposed or formed by the transfer molding technology using dies. The resinous encapsulant M may be made typically from an epoxy resin. The heating to form the resinous encapsulant M in the step operates at a temperature typically from 165° C. to 185° C. for a time typically from 60 seconds to several minutes. The resinous encapsulant M, when not sufficiently cured in the encapsulation step, subsequently undergoes a postcure step to be fully cured.

Thus, a semiconductor device including semiconductor chips in sinter-bonded areas can be manufactured.

The semiconductor device manufacturing method according to the embodiment may perform a picking-up step and a subsequent reversing step as follows, instead of the reversing step described above with reference to FIG. 1(d) and the picking-up step described above with reference to FIG. 2.

Figure 5A:
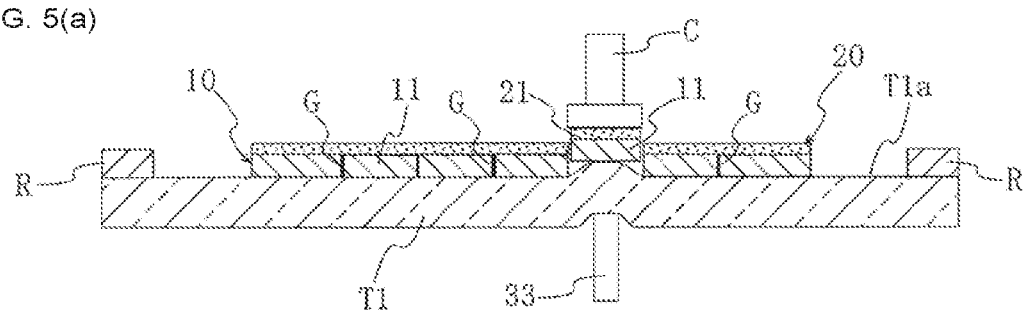
FIGs. 5(a)-5(b) illustrates some steps in a semiconductor device manufacturing method according to one embodiment of the present invention.
Figure 5B:
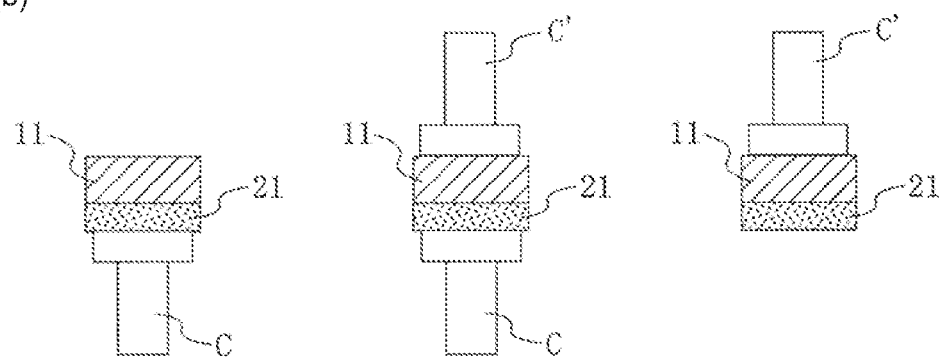

After the lamination step described above with reference to FIG. 1(c), namely, after the step of laminating the sinter-bonding sheet 20 onto the diced semiconductor wafer 10 on the dicing tape T1, a target semiconductor chip 11 together with the sinter-bonding material layer 21 in intimate contact with the chip is picked up from the dicing tape T1 to give a sinter-bonding material layer-associated semiconductor chip 11 (picking-up step), as illustrated in FIG. 5(a). In this picking-up step, a suction collet C is used to hold the semiconductor chip 11 by the suction action upon the sinter-bonding material layer 21 of the sinter-bonding material layer-associated semiconductor chip 11. Next, the suction collet C, which has picked-up the sinter-bonding material layer-associated semiconductor chip 11, transfers the semiconductor chip 11 to another suction collet C' (reversing step), as illustrated in FIG. 5(b). The suction collet C' holds the semiconductor chip 11 by the suction action upon the chip-mounting side in the sinter-bonding material layer-associated semiconductor chip 11. The resulting sinter-bonding material layer-associated semiconductor chip 11 will undergo a temporary securing step as described above with reference to FIG. 3(a).

Figure 6A:
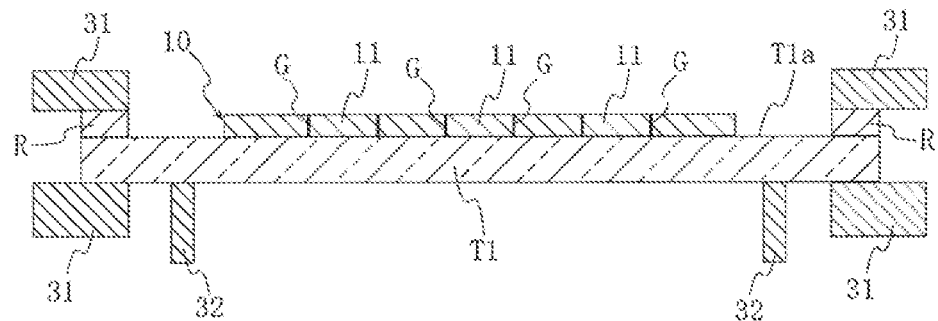
FIGS. 6(a)-6(c) illustrates some steps in a semiconductor device manufacturing method according to one embodiment of the present invention.
Figure 6B:
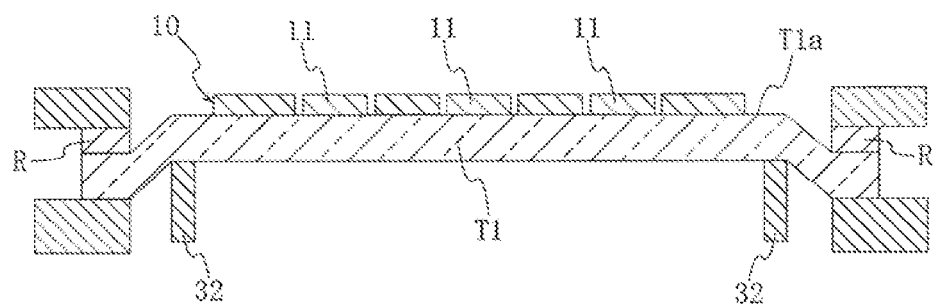
Figure 6C:
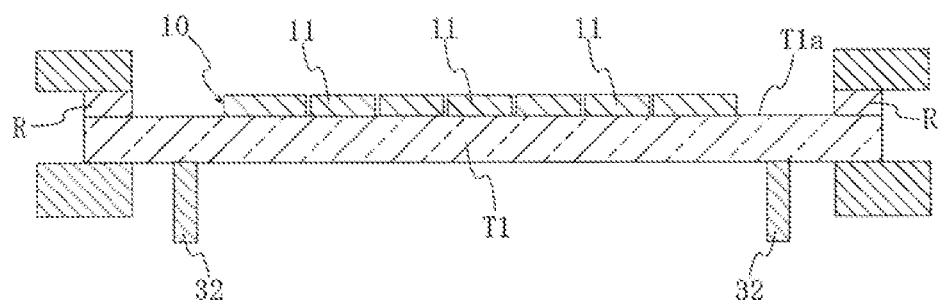

The semiconductor device manufacturing method according to the embodiment may preform an expanding step between the dicing step described above with reference to FIGS. 1(a) and 1(b) and the lamination step described above with reference to FIG. 1(c). In the expanding step, the dicing tape T1, which holds the diced semiconductor wafer 10, is temporarily expanded, as illustrated in FIGS. 6(a)-6(c).

The expanding step employs an expander. Initially, as illustrated in FIG. 6(a), the dicing tape T1 bearing the diced semiconductor wafer 10 and a ring frame R on the adhesive face T1a is secured to a holder 31 of the expander. Next, as illustrated in FIG. 6(b), a hollow cylindrical plunger 32 of the expander ascends while coming in contact with the dicing tape T1 from below. This expands the dicing tape T1, on which the diced semiconductor wafer 10 is laminated, so as to allow the dicing tape T1 to elongate in two-dimensional directions including the radial direction and the circumferential direction of the diced semiconductor wafer 10. The expanding operates at a temperature of typically −20° C. to 70° C. Then, the plunger 32 descends to release the dicing tape T1 from the expanded state, as illustrated in FIG. 6(c). After the expansion, a portion outside of the region in which the diced semiconductor wafer is held in the dicing tape T1 may shrink by heating. The heating operates at a temperature of typically 100° C. to 300° C. This configuration is preferred for restraining the separation distance between the semiconductor chips 11 from narrowing after the expansion.

Figure 7A:
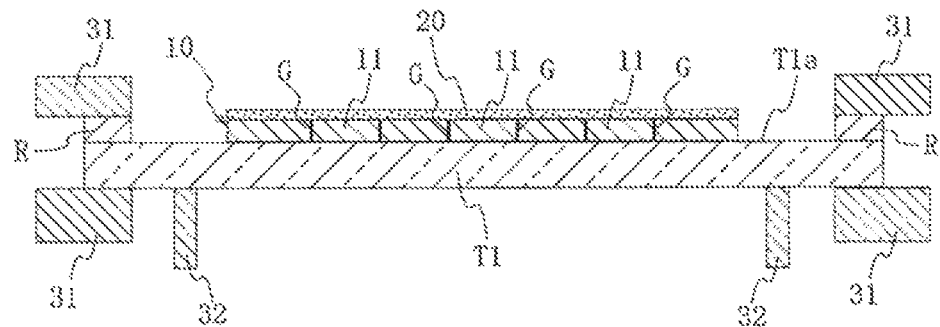
FIGS. 7(a)-7(c) illustrates some steps in a semiconductor device manufacturing method according to one embodiment of the present invention.
Figure 7B:
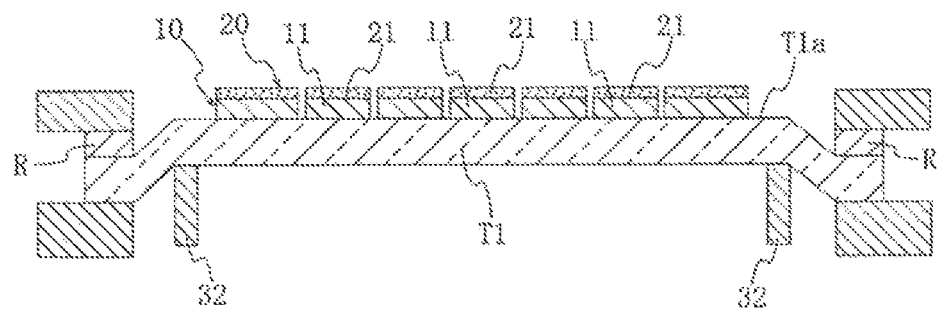
Figure 7C:
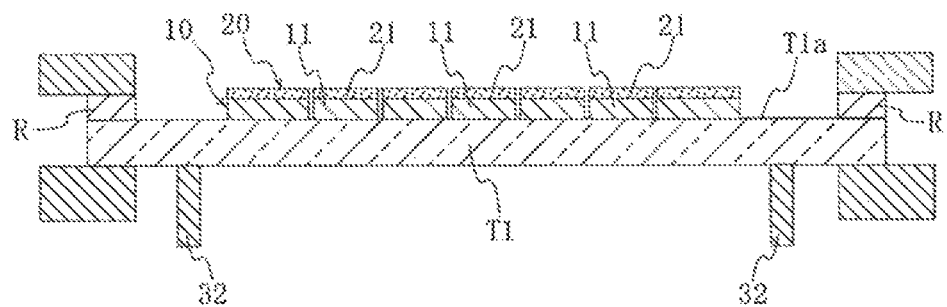

The semiconductor device manufacturing method according to the embodiment may perform an expanding step as illustrated in FIGS. 7(a)-7(c), between the lamination step described above with reference to FIG. 1(c) and the reversing step described above with reference to FIG. 1(d). When the method employs the step described above with reference to FIGS. 5(a)-5(b), the method may perform the expanding step as illustrated in FIGS. 7(a)-7(c) between the lamination step described above with reference to FIG. 1(c) and the picking-up step described above with reference to FIG. 5(a).

This expanding step employs an expander. Initially, as illustrated in FIG. 7(a), the dicing tape T1 bearing the diced semiconductor wafer 10 with the sinter-bonding sheet 20 and a ring frame R on the adhesive face T1a is secured to a holder 31 of the expander. Next, as illustrated in FIG. 7(b), a hollow cylindrical plunger 32 of the expander ascends while coming in contact with the dicing tape T1 from below. This expands the dicing tape T1, on which the diced semiconductor wafer 10 is laminated, so as to allow the dicing tape T1 to elongate in two-dimensional directions including the radial direction and the circumferential direction of the diced semiconductor wafer 10. The expanding operates at a temperature of typically −20° C. to 70° C. Then, the plunger 32 descends to release the dicing tape T1 from the expanded state, as illustrated in FIG. 7(c). After the expansion, a portion outside of the region of the dicing tape T1 in which the diced semiconductor wafer is held may shrink by heating. The heating operates at a temperature of typically 100° C. to 300° C. This configuration is preferred for restraining the separation distance between the semiconductor chips 11 from narrowing after the expansion. The expanding step as above can surely provide sufficient separation distance between the pick-up target semiconductor chips 11 before the picking-up step and therefore enables the picking-up step to operate appropriately.

The semiconductor device manufacturing method according to the embodiment may perform a dicing step as illustrated in FIGS. 8(a)-8(d), instead of the dicing step described above with reference to FIGS. 1(a) and 1(b).

Figure 8A:
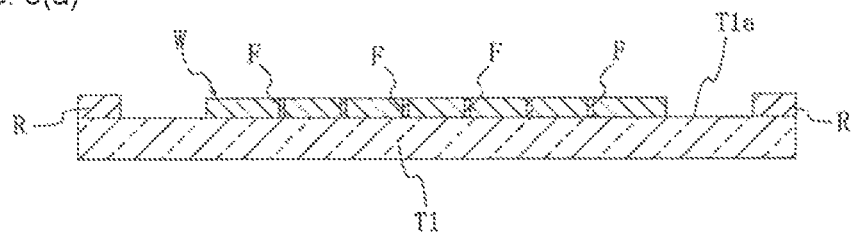
FIGS. 8(a)-8(d) illustrates some steps in a semiconductor device manufacturing method according to one embodiment of the present invention.

In this dicing step, initially, the semiconductor wafer W being held on the dicing tape T1 undergoes stealth dicing, to form embrittled regions (weakened regions) F in the semiconductor wafer W, where the embrittled regions F contribute to cleaving of the wafer into semiconductor chips, as illustrated in FIG. 8(a).

In the stealth dicing, laser light, whose collecting spot is focused on the inside of the semiconductor wafer W, is applied to the semiconductor wafer W along intended dicing lines typically from the side opposite to the dicing tape T1. Thus, the embrittled regions F are formed in the semiconductor wafer W due to ablation by multiphoton absorption. Such a technique for forming embrittled regions F in a semiconductor wafer on intended dicing lines by laser irradiation is described in detail typically in JP-A No. 2002-192370. In the embodiment, laser irradiation conditions may be adjusted as appropriate typically within the following condition ranges.

Laser Irradiation Conditions
(A) Laser Light
  Laser source: diode-pumped Nd:YAG laser
  Wavelength: 1064 nm
  Laser spot cross-sectional area: $3.14 \times 10^{-8}$ cm$^2$
  Laser form: Q switched pulse
  Pulse rate: 100 kHz or less
  Pulse duration: 1 µs or shorter
  Output: 1 mJ or less
  Laser quality: TEM00
  Polarization property: linear polarization
(B) Condenser Lens
  Magnifying power: 100× or less
  Numerical aperture (NA): 0.55
  Transmittance relative to laser light wavelength: 100% or less
(C) Traveling Speed of the Table on which the Semiconductor Substrate is placed: 280 mm/sec or Less Before or after the stealth dicing as above, the semiconductor wafer W may be thinned by grinding on the backside of the wafer. The semiconductor wafer W, which has undergone the stealth dicing, is in such a state as to be cleaved along the embrittled regions F by expansion of the dicing tape T1 which holds the wafer.

Figure 8B:
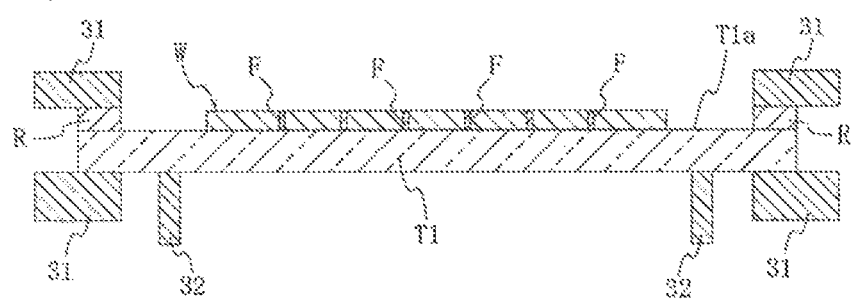
Figure 8C:
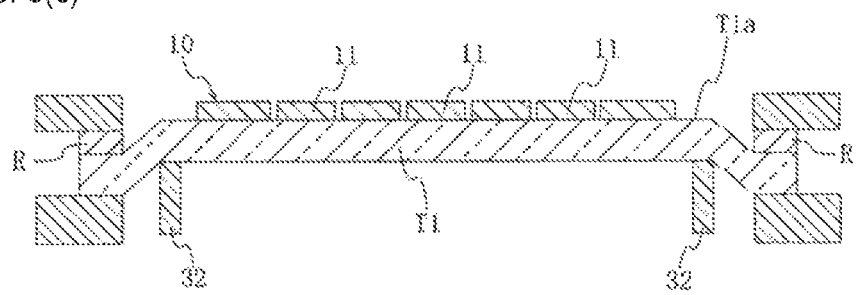
Figure 8D:
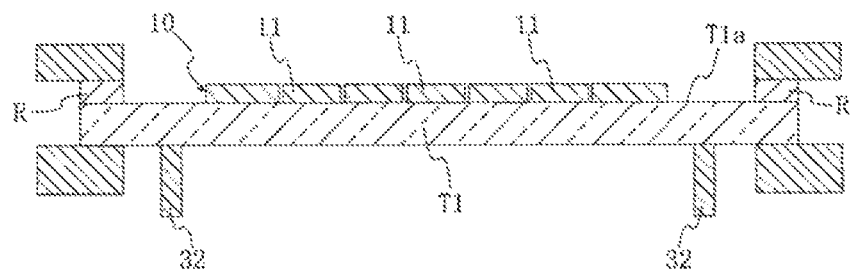

In this dicing step, next, the dicing tape T1 bearing the semiconductor wafer W after the stealth dicing and a ring frame R on the adhesive face T1a is secured to a holder 31 of an expander, as illustrated in FIG. 8(b). Next, the dicing tape T1 holding the semiconductor wafer W after the stealth dicing is temporarily expanded, to cleave the semiconductor wafer W, as illustrated in FIGS. 8(c) and 8(d). Specifically, initially, a hollow cylindrical plunger 32 of the expander ascends while coming in contact with the dicing tape T1 from below. This allows the dicing tape T1 on which the semiconductor wafer W is laminated to elongate in two-dimensional directions including the radial direction and the circumferential direction of the semiconductor wafer W, as illustrated in FIG. 8(c). The expansion operates at a temperature of typically from −20° C. to 70° C. The expansion as above causes cracking in the embrittled regions F in the semiconductor wafer W, to dice the semiconductor wafer W into semiconductor chips 11. Then, the plunger 32 descends to release the dicing tape T1 from the expanded state, as illustrated in FIG. 8(d). After the expansion, a portion outside of the region of the dicing tape T1 in which the diced semiconductor wafer is held may shrink by heating. The heating operates at a temperature of typically 100° C. to 300° C. This configuration is preferred for restraining the separation distance between the semiconductor chips 11 from narrowing after the expansion.

The dicing step as above can also provide the diced semiconductor wafer 10 on the dicing tape T1. The semiconductor chips 11 in the diced semiconductor wafer 10 exist with spacing of typically 10 to 500 µm. The formed diced semiconductor wafer 10 will undergo the lamination step described above with reference to FIG. 1(c).

In the lamination step described above with reference to FIG. 1(c) in the semiconductor device manufacturing method as described above, the sinter-bonding sheet 20 for supplying the sinter-bonding material is laminated onto the diced semiconductor wafer 10 (including the semiconductor chips 11 after singularization) on the dicing tape T1. This configuration is suitable for efficient batchwise supply of the sinter-bonding material to each of the semiconductor chips 11, namely, suitable for efficient batchwise transfer and formation of the sinter-bonding material layer 21 onto each of the semiconductor chips 11.

In addition, in the semiconductor device manufacturing method according to the embodiment, the diced semiconductor wafer 10 (namely, the semiconductor wafer W after singularization into chips while being held on the dicing tape T1) formed on the dicing tape T1 in the dicing step has a spacing between chips of typically 10 to 500 µm, as described above. The spacing between chips is smaller typically than the semiconductor chip thickness and is short. In the lamination step, the sinter-bonding sheet 20 is laminated onto the diced semiconductor wafer 10 as above (namely, the sinter-bonding sheet 20 is not laminated onto semiconductor chips with relatively large clearance (spacing) between them, which chips have been singularized from a semiconductor wafer W and then arranged on a predetermined processing tape). Consequently, the semiconductor device manufacturing method according to the embodiment is suitable for reducing loss of a sinter-bonding material in batchwise supply of the sinter-bonding material to each of the semiconductor chips 11.

As described above, the semiconductor device manufacturing method according to the embodiment is suitable for efficiently supplying the sinter-bonding material to each semiconductor chip 11 while reducing loss of the sinter-bonding material.

FIGS. 9 and 10 illustrate a semiconductor device manufacturing method according to one embodiment of the present invention. The semiconductor device manufacturing method according to the embodiment is a manufacturing method for a power semiconductor device or another semiconductor device including semiconductor chips in sinter-bonded areas. The method includes a stealth dicing step, a lamination step, a cleaving step, a picking-up step, a temporary securing step, and a sinter bonding step as follows.

Figure 9A:
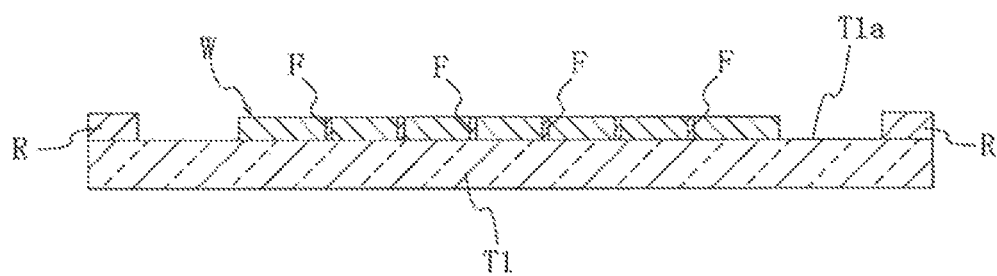
FIGS. 9(a)-9(b) illustrates some steps in a semiconductor device manufacturing method according to one embodiment of the present invention.

In the stealth dicing step, initially, a semiconductor wafer W being held on a dicing tape T1 undergoes stealth dicing, to form embrittled regions F in the semiconductor wafer W, as illustrated in FIG. 9(a), where the embrittled regions F will serve to cleave the wafer into semiconductor chips. Before or after the stealth dicing as above, the semiconductor wafer W may be thinned by grinding on its backside (in the embodiment, the upper side in the figure). The semiconductor wafer W after the stealth dicing is in such a state as to be cleavable along the embrittled regions F by the expansion of the dicing tape T1. Specific embodiments and conditions of the stealth dicing on the semiconductor wafer W are as described above with reference to FIG. 8(a).

Figure 9B:
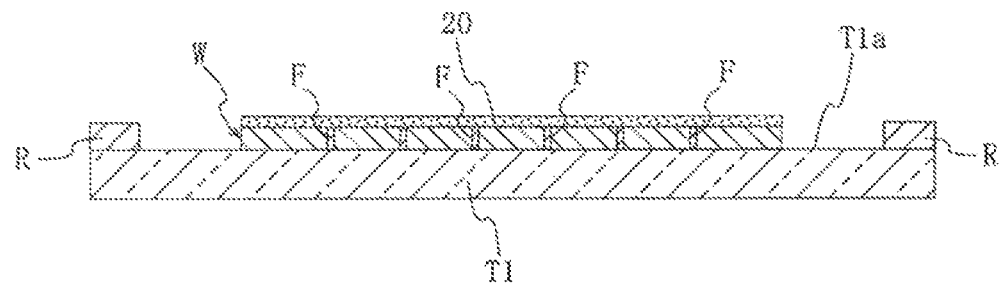

In the embodiment, next, the sinter-bonding sheet 20 is laminated onto the semiconductor wafer W (lamination step), as illustrated in FIG. 9(b). The sinter-bonding sheet 20 is a sheet of a composition including a conductive metal-containing sinterable particles and a binder component, as described above. The sinter-bonding sheet 20 is laminated onto the surface or the backside of the semiconductor wafer W on the dicing tape T1, so that the sheet exists opposite to the dicing tape T1. A non-limiting example of the pressing means or device for lamination is a pressure roller. The lamination operates at a temperature of typically from room temperature to 200° C. under a load of typically from 0.01 to 10 MPa. The step enables efficient batchwise supply of the sinter-bonding material to individual portions of the semiconductor wafer W to be singularized (diced) into semiconductor chips, namely, efficient batchwise transfer and formation of the sinter-bonding material layer onto individual portions of the semiconductor wafer W to be singularized into semiconductor chips.

Figure 10A:
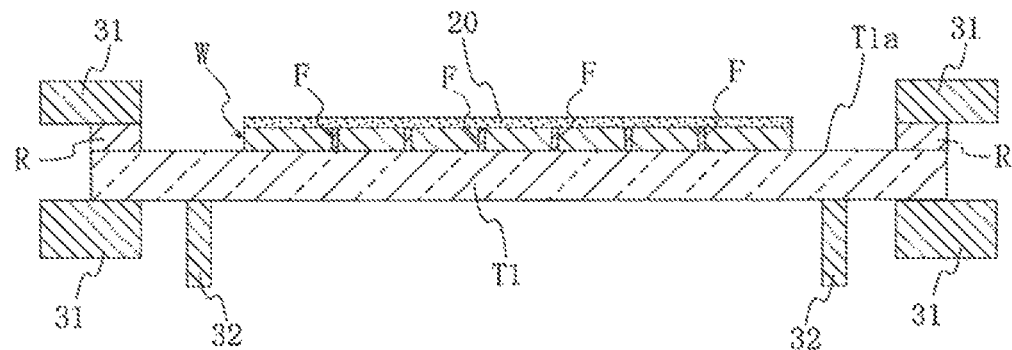
FIGS. 10(a)-10(c) illustrates steps subsequent to the steps illustrated in FIGS. 9(a)-9(b)
Figure 10B:
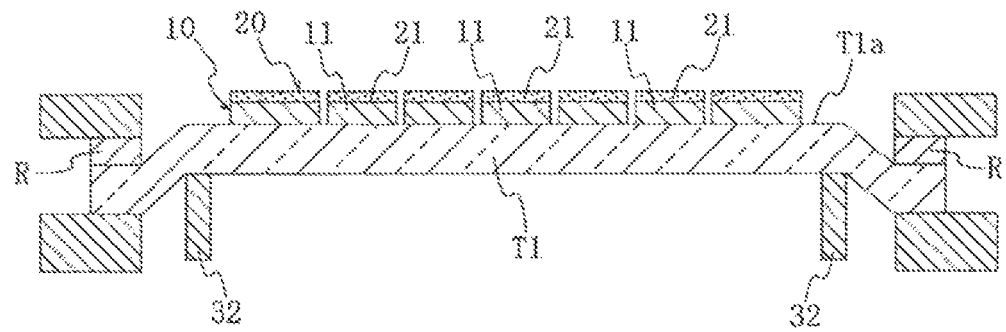
Figure 10C:
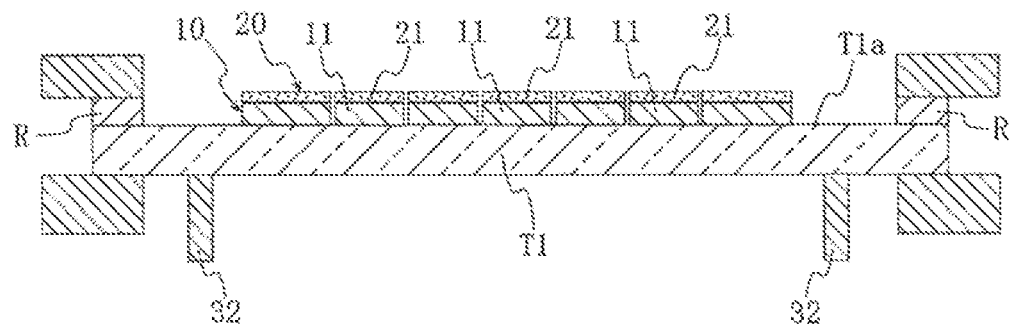

Next, the method performs the cleaving step as illustrated in FIGS. 10(a)-(c). The step employs an expander. Initially, the dicing tape T1 bearing the semiconductor wafer W with the sinter-bonding sheet 20 and a ring frame R on the adhesive face T1a is secured to a holder 31 of the expander, as illustrated in FIG. 10(a). Next, a hollow cylindrical plunger 32 of the expander ascends while coming in contact with the dicing tape T1 from below to expand the dicing tape T1 on which the semiconductor wafer W is laminated, so as to elongate the dicing tape T1 in two-dimensional directions including the radial direction and the circumferential direction of the semiconductor wafer W, as illustrated in FIG. 10(b). The expansion operates at a temperature of typically from −20° C. to 70° C. The expansion as above causes cracking of the semiconductor wafer W in the embrittled regions F, and the semiconductor wafer W is diced into semiconductor chips 11. Then the plunger 32 descends to release the dicing tape T1 from the expanded state, as illustrated in FIG. 10(c). As described above, the cleaving step temporarily expands the dicing tape T1 holding the semiconductor wafer W, and thereby cleaves the semiconductor wafer W together with the overlying sinter-bonding sheet 20. This can form a diced semiconductor wafer 10 which includes semiconductor chips 11 each adhering to a sinter-bonding material layer 21 derived from the sinter-bonding sheet 20. After the expansion, a portion of the dicing tape T1 outside the region in which the diced semiconductor wafer is held may shrink by heating. The heating operates at a temperature of typically 100° C. to 300° C. This configuration is preferred for restraining the separation distance between the semiconductor chips 11 from narrowing after the expansion.

After the cleaving step, the method according to the embodiment performs the reversing step described above with reference to FIG. 1(d); the picking-up step described above with reference to FIG. 2; the temporary securing step described above with reference to FIG. 3(a); the sinter bonding step described above with reference to FIG. 3(b); the wire bonding step described above with reference to FIG. 4(a); and the encapsulation step described above with reference to FIG. 4(b), each of which steps has been described relating to the other embodiment. The method may perform the picking-up step described above with reference to FIG. 5(a) and the reversing step described above with reference to FIG. 5(b), instead of the reversing step described above with reference to FIG. 1(d) and the picking-up step described above with reference to FIG. 2, each of which steps has been described relating to the other embodiment.

A semiconductor device including semiconductor chips in sinter-bonded areas can be produced by the above procedure.

In the lamination step described above with reference to FIG. 9(b) in the semiconductor device manufacturing method according to the embodiment, the sinter-bonding sheet 20 for supplying the sinter-bonding material is laminated onto the semiconductor wafer W after stealth dicing on the dicing tape T1. The configuration as above is suitable for efficient batchwise supply of the sinter-bonding material to individual portions of the semiconductor wafer W which will be singularized (diced) into semiconductor chips, namely, efficient batchwise transfer and formation of the sinter-bonding material layer 21 onto individual portions of the semiconductor wafer W which will be singularized into semiconductor chips.

In addition, in the lamination step in the embodiment, the sinter-bonding sheet 20 is laminated on a semiconductor wafer W which has not undergone singularization into chips (namely, semiconductor wafer W without chip-to-chip clearance). The lamination step as above enables compression bonding of the sinter-bonding sheet 20 for supplying the sinter-bonding material to the semiconductor wafer W in entire regions for the sheet to be laminated on the wafer. Accordingly, the semiconductor device manufacturing method according to the embodiment is suitable for reducing loss of the sinter-bonding material fed to the semiconductor chips 11 obtained in course of the process.

As described above, the semiconductor device manufacturing method according to the embodiment is suitable for efficiently supplying the sinter-bonding material to each of the semiconductor chips 11 while reducing loss of the sinter-bonding material.

FIGS. 11(a)-11(d) illustrates some steps of a semiconductor device manufacturing method according to one embodiment of the present invention. The semiconductor device manufacturing method according to the embodiment is a manufacturing method for a power semiconductor device or another semiconductor device including semiconductor chips in sinter-bonded areas. The method includes a lamination step, a singularization step, a picking-up step, a temporary securing step, and a sinter bonding step as follows.

Figure 11A:
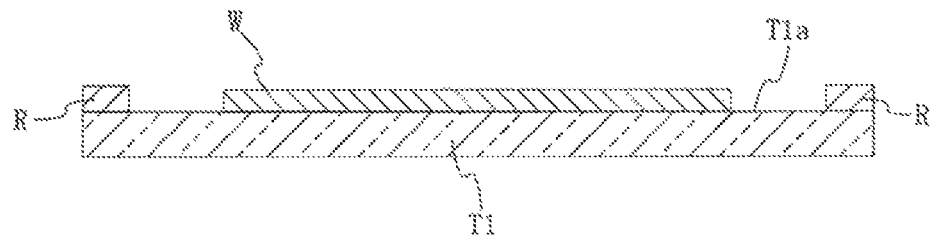
FIGS. 11(a)-11(d) illustrates some steps in a semiconductor device manufacturing method according to one embodiment of the present invention.
Figure 11B:
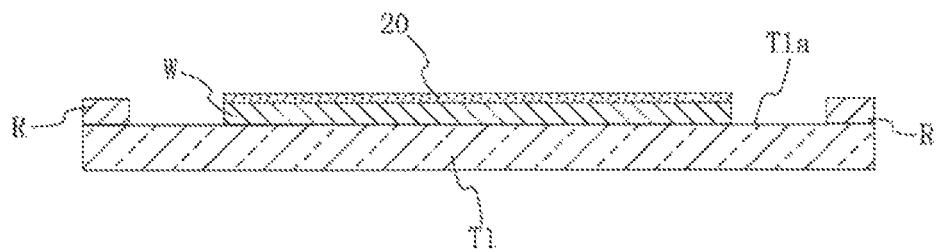

In the lamination step, a sinter-bonding sheet 20 is laminated onto a semiconductor wafer W being held on an adhesive face T1a of a dicing tape T1, as illustrated in FIGS. 11(a) and 11(b). The sinter-bonding sheet 20 is a sheet of a composition including a binder component and conductive metal-containing sinterable particles, as described above. The sinter-bonding sheet 20 is laminated onto the surface or the backside of the semiconductor wafer W on the dicing tape T1 so that the sheet exists opposite to the dicing tape T1. A non-limiting example of the pressing means or device for lamination is a pressure roller. The lamination operates at a temperature typically from room temperature to 200° C. under a load of typically 0.01 to 10 MPa. The step enables efficient batchwise supply of the sinter-bonding material to individual portions of the semiconductor wafer W which will be singularized (diced) into semiconductor chips, namely, efficient batchwise transfer and formation of the sinter-bonding material layer onto individual portions of the semiconductor wafer W which will be singularized into semiconductor chips. Before the step, the semiconductor wafer W may be thinned by grinding on the backside (in the embodiment, the upper side in the figure).

Figure 11C:
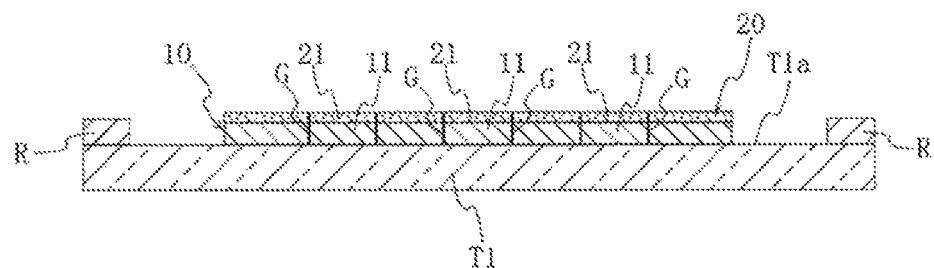

Next, the method performs the singularization step as illustrated in FIG. 11(c). Specifically, a rotary blade (not shown) of a dicer is driven while the semiconductor wafer W with the sinter-bonding sheet 20 is held on the adhesive face T1a of the dicing tape T1. Thus, cutting of the semiconductor wafer W and the sinter-bonding sheet 20 lying on the wafer W proceeds. The cutting proceeds along intended cutting lines, while running water is continuously fed toward the rotary blade and the semiconductor wafer W. In FIG. 11(c), cutting grooves G formed using the dicing rotary blade are schematically indicated by thick lines. The cutting grooves G may reach the inside of the dicing tape T1. Through the singularization step as above, a diced semiconductor wafer 10 is formed on the dicing tape T1, where the diced semiconductor wafer 10 includes semiconductor chips 11 adhering to a sinter-bonding material layer 21 derived from the sinter-bonding sheet 20.

Figure 11D:
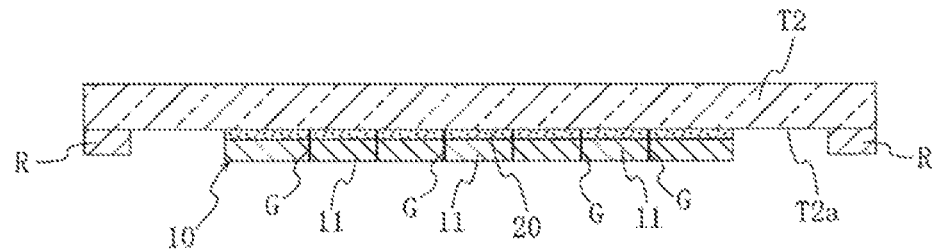

In the embodiment, the method performs the reversing step as illustrated in FIG. 11(d) after the lamination step. Specifically, in the step, a wafer processing tape T2 having an adhesive face T2a is laminated on the work, and the dicing tape T1 is removed from the work, where the work is the diced semiconductor wafer 10 with the sinter-bonding sheet 20. The adhesive face T2a of the processing tape T2 has an adhesive strength equal to or higher than the adhesive strength of the adhesive face T1a of the processing tape T1. In the step, for example, the adhesive face T2a of the wafer processing tape T2 adheres to the sinter-bonding sheet 20 in the diced semiconductor wafer 10 with the sinter-bonding sheet 20, and then the dicing tape T1 is removed from the diced semiconductor wafer 10.

After the singularization step, the method according to the embodiment performs the picking-up step described above with reference to FIG. 2; the temporary securing step described above with reference to FIG. 3(a); the sinter bonding step described above with reference to FIG. 3(b); the wire bonding step described above with reference to FIG. 4(a); and the encapsulation step described above with reference to FIG. 4(b), each of which steps has been described relating to the other embodiment.

In the embodiment, the method may preform a picking-up step and a subsequent reversing step as follows, instead of the reversing step described above with reference to FIG. 11(d) and the picking-up step described above with reference to FIG. 2.

Figure 12A:
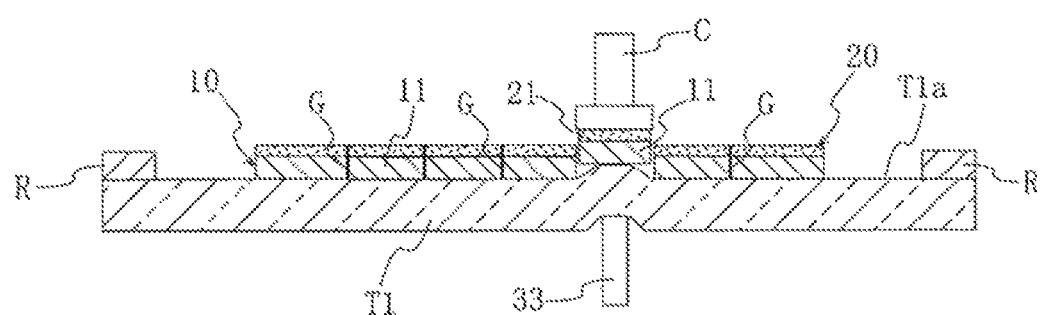
FIGS. 12(a)-12(b) illustrates some steps in a semiconductor device manufacturing method according to one embodiment of the present invention.
Figure 12B:
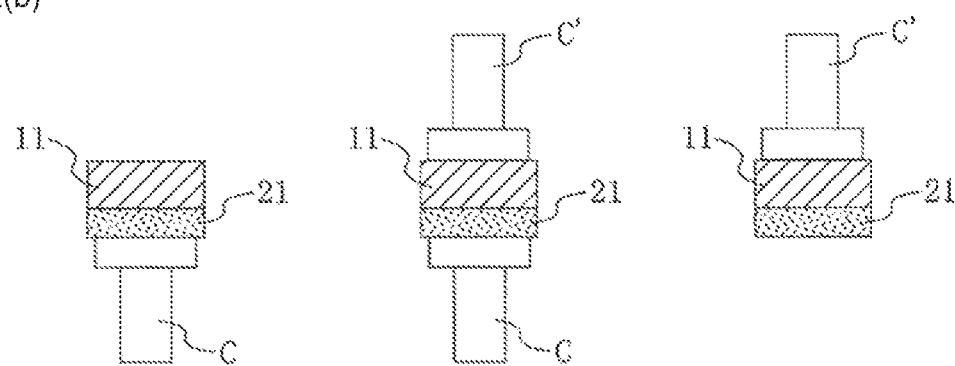

After the singularization step described above with reference to FIG. 11(c), a target semiconductor chip 11 together with the sinter-bonding material layer 21 adhering to the chip is picked up from the dicing tape T1 to give a sinter-bonding material layer-associated semiconductor chip 11, as illustrated in FIG. 12(a) (picking-up step). In this picking-up step, a suction collet C is used to hold the semiconductor chip 11 by the sucking action upon the sinter-bonding material layer 21 side of the sinter-bonding material layer-associated semiconductor chip 11. Next, the suction collet C, which has picked up the sinter-bonding material layer-associated semiconductor chip 11, transfers the semiconductor chip 11 to another suction collet C', as illustrated in FIG. 12(b) (reversing step). The suction collet C' holds the semiconductor chip 11 by the sucking action upon the chip side of the sinter-bonding material layer-associated semiconductor chip 11. The sinter-bonding material layer-associated semiconductor chip 11 will undergo the temporary securing step as described above with reference to FIG. 3(a).

In the embodiment, the method may perform a singularization step through stealth dicing as follows, instead of the singularization step through blade dicing described above with reference to FIG. 11(c).

Figure 13A:
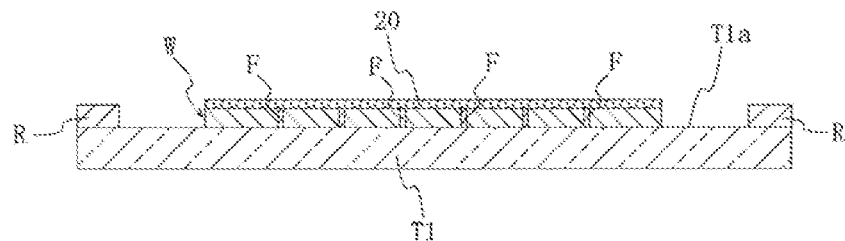
FIGS. 13(a)-13(d) illustrates some steps in a semiconductor device manufacturing method according to one embodiment of the present invention.

Initially, the semiconductor wafer W being held on the dicing tape T1 receives stealth dicing, to form embrittled regions F in the semiconductor wafer W as illustrated in FIG. 13(a), where the embrittled regions F will serve to cleave the wafer into semiconductor chips. The semiconductor wafer W after stealth dicing is in such a state as to be cleavable along the embrittled regions F by the expansion of the dicing tape T1 which holds the wafer. Specific embodiments and conditions for the stealth dicing on the semiconductor wafer W are as described above with reference to FIG. 8(a).

Figure 13B:
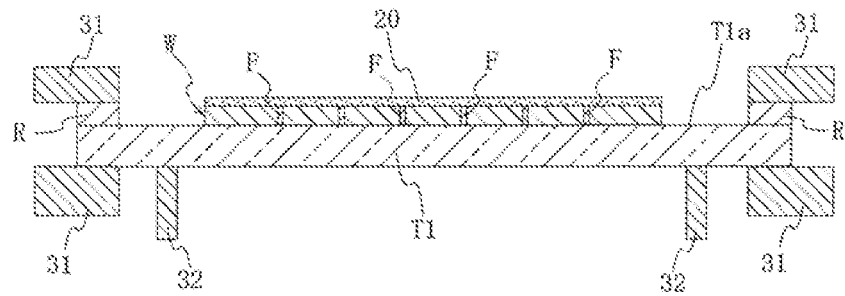
Figure 13C:
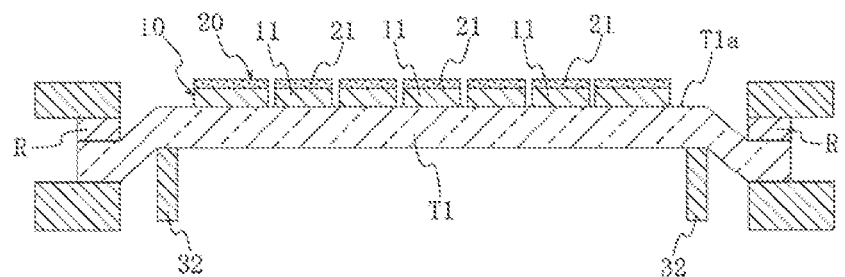
Figure 13D:
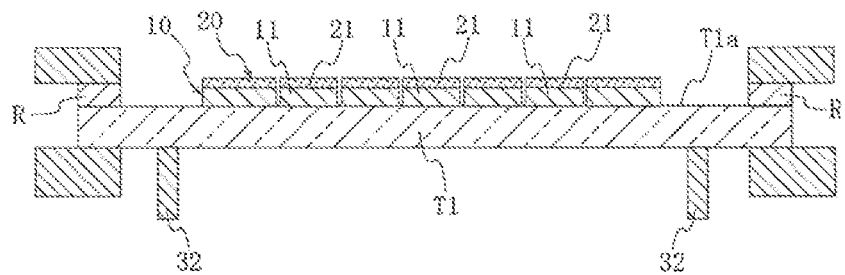

Next, the dicing tape T1 bearing the semiconductor wafer W with the sinter-bonding sheet 20 and a ring frame R on the adhesive face T1a is secured to a holder 31 of an expander, as illustrated in FIG. 13(b). Next, a hollow cylindrical plunger 32 of the expander ascends while coming in contact with the dicing tape T1 from below, to expand the dicing tape T1, on which the semiconductor wafer W is laminated, so as to elongate the dicing tape T1 in two-dimensional directions including the radial direction and the circumferential direction of the semiconductor wafer W, as illustrated in FIG. 13(c). The expansion operates at a temperature of typically from −20° C. to 70° C. The expansion as above causes cracking in the embrittled regions F in the semiconductor wafer W and thereby causes the wafer W to be singularized (diced) into semiconductor chips 11. Then, the plunger 32 descends to release the dicing tape T1 from the expanded state, as illustrated in FIG. 13(d). As described above, in this singularization step, the dicing tape T1 holding the semiconductor wafer W is temporarily expanded. This cleaves the semiconductor wafer W together with the overlying sinter-bonding sheet 20 and enables formation of a diced semiconductor wafer 10 including the semiconductor chips 11 each adhering to a sinter-bonding material layer 21 derived from the sinter-bonding sheet 20. After the expansion, a portion in the dicing tape T1 outside the region in which the diced semiconductor wafer is held may shrink by heating. The heating operates at a temperature of typically from 100° C. to 300° C. This configuration is preferred for restraining the separation distance between the semiconductor chips 11 from narrowing after the expansion.

A semiconductor device including semiconductor chips in sinter-bonded areas can be manufactured by the procedure as above.

The semiconductor device manufacturing method according to the embodiment performs the lamination step described above with reference to FIG. 11(b) so as to laminate the sinter-bonding sheet 20 onto the semiconductor wafer W on the dicing tape T1 as described above, where the sinter-bonding sheet 20 will serve to supply the sinter-bonding material. The configuration as above is suitable for efficient batchwise supply of the sinter-bonding material to individual portions of the semiconductor wafer W to be singularized (diced) into semiconductor chips 11, namely, for efficient batchwise transfer and formation of the sinter-bonding material layer to the portions in the semiconductor wafer W to be singularized into semiconductor chips.

In addition, in the lamination step of the semiconductor device manufacturing method according to the embodiment, the sinter-bonding sheet 20 is laminated onto the semiconductor wafer W which has not undergone singularization into chips (namely, semiconductor wafer W without chip-to-chip clearance). The lamination step as above allows the sinter-bonding sheet 20 for supplying the sinter-bonding material to bond to the semiconductor wafer W through compression bonding in entire regions to be laminated with the wafer. Consequently, the semiconductor device manufacturing method according to the embodiment is suitable for reducing loss of the sinter-bonding material to be fed to the semiconductor chips 11 obtained through the process.

As described above, the semiconductor device manufacturing method according to the embodiment is suitable for efficiently supplying the sinter-bonding material to each of the semiconductor chips 11 while reducing loss of the sinter-bonding material.

W semiconductor wafer
G cutting groove
F embrittled regions
10 diced semiconductor wafer
11 semiconductor chip
20 sinter-bonding sheet
21 sinter-bonding material layer
22 sintered layer
T1 dicing tape
T2 wafer processing tape
S supporting substrate (substrate)

The invention claimed is:

1. A method for manufacturing a semiconductor device, the method comprising the steps of:
   dicing a semiconductor wafer being held on a dicing tape into a diced semiconductor wafer including a plurality of semiconductor chips;
   laminating a sinter-bonding sheet prepared by forming a coating including a binder component and sinterable particles containing a conductive metal onto a separator serving as a carrier or a substrate and drying the coating onto the diced semiconductor wafer on the dicing tape so that the sinter-bonding sheet exists opposite to the dicing tape, to transfer a sinter-bonding material layer derived from the sinter-bonding sheet to each of the semiconductor chips;
   picking up the semiconductor chips together with the sinter-bonding material layer adhering to each of the chips, to give semiconductor chips each with the sinter-bonding material layer;
   temporarily securing, to a substrate, the semiconductor chips each with the sinter-bonding material layer through the sinter-bonding material layer; and
   forming sintered layers, through a heating process, from the sinter-bonding material layers lying between the semiconductor chips and the substrate which are temporarily secured to each other, to bond the semiconductor chips to the substrate.

2. The method for manufacturing a semiconductor device according to claim 1,
   wherein the diced semiconductor wafer is formed in the dicing step by blade dicing of the semiconductor wafer.

3. The method for manufacturing a semiconductor device according to claim 1, further comprising, between the dicing step and the lamination step, the step of
   temporarily expanding the dicing tape which holds the diced semiconductor wafer.

4. The method for manufacturing a semiconductor device according to claim 1, further comprising, between the lamination step and the picking-up step, the step of
   temporarily expanding the dicing tape which holds the diced semiconductor wafer.

5. The method for manufacturing a semiconductor device according to claim 1, wherein the diced semiconductor wafer is formed in the dicing step by:
   forming embrittled regions in the semiconductor wafer being held on the dicing tape, where the embrittled regions will serve to cleave the wafer into semiconductor chips; and
   expanding the dicing tape which holds the semiconductor wafer, to cleave the semiconductor wafer.

6. The method for manufacturing a semiconductor device according to claim 1,
   wherein the picking-up step comprises picking up the semiconductor chips each with the sinter-bonding material layer from the dicing tape.

7. The method for manufacturing a semiconductor device according to claim 1, further comprising, between the lamination step and the picking-up step, the step of
   laminating a wafer processing tape onto the sinter-bonding sheet in the diced semiconductor wafer with the sinter-bonding sheet, and removing the dicing tape from the diced semiconductor wafer,
   wherein the picking-up step comprises picking up the semiconductor chips each with the sinter-bonding material layer from the wafer processing tape.

8. The method for manufacturing a semiconductor device according to claim 4, further comprising, between the expanding step and the picking-up step, the step of
   laminating a wafer processing tape onto the sinter-bonding material layer adhering to each of the semiconductor chips in the diced semiconductor wafer, and removing the dicing tape from the diced semiconductor wafer, where the sinter-bonding material layer is derived from the sinter-bonding sheet,
   wherein the picking-up step comprises picking up the semiconductor chips each with the sinter-bonding material layer from the wafer processing tape.

9. A method for manufacturing a semiconductor device, the method comprising the steps of:
   forming embrittled regions in a semiconductor wafer being held on a dicing tape, where the embrittled regions will serve to cleave the wafer into a plurality of semiconductor chips;
   laminating a sinter-bonding sheet prepared by forming a coating including a binder component and sinterable particles containing a conductive metal onto a separator serving as a carrier or substrate and drying the coating onto the semiconductor wafer on the dicing tape so that the sinter-bonding sheet exists opposite to the dicing tape;
   cleaving the semiconductor wafer together with the sinter-bonding sheet by expanding the dicing tape which holds the semiconductor wafer, to form a diced semiconductor wafer including the plurality of semiconductor chips each adhering to a sinter-bonding material layer derived from the sinter-bonding sheet;
   picking up the semiconductor chips together with the sinter-bonding material layer adhering to each of the chips, to give semiconductor chips each with the sinter-bonding material layer;
   temporarily securing, to a substrate, the semiconductor chips each with the sinter-bonding material layer through the sinter-bonding material layer; and
   forming, through a heating process, sintered layers from the sinter-bonding material layers lying between the semiconductor chips and the substrate which are temporarily secured to each other, to bond the semiconductor chips to the substrate.

10. A method for manufacturing a semiconductor device, the method comprising the steps of:
    laminating a sinter-bonding sheet prepared by forming a coating including a binder component and sinterable particles containing a conductive metal onto a separator serving as a carrier or substrate and drying the coating onto a semiconductor wafer being held on a dicing tape so that the sinter-bonding sheet exists opposite to the dicing tape;
    singularizing the semiconductor wafer on the dicing tape together with the sinter-bonding sheet to form a diced semiconductor wafer including a plurality of semiconductor chips each adhering to a sinter-bonding material layer derived from the sinter-bonding sheet;

picking up the semiconductor chips together with the sinter-bonding material layer adhering to the chips, to give semiconductor chips each with the sinter-bonding material layer;

temporarily securing, to a substrate, the semiconductor chips each with the sinter-bonding material layer through the sinter-bonding material layer; and forming, through a heating process, sintered layers from the sinter-bonding material layers lying between the semiconductor chips and the substrate which are temporarily secured to each other, to bond the semiconductor chips to the substrate.

11. The method for manufacturing a semiconductor device according to claim 10, wherein the diced semiconductor wafer is formed in the singularization step by blade dicing of the semiconductor wafer and the sinter-bonding sheet lying on the wafer.

12. The method for manufacturing a semiconductor device according to claim 10, wherein the diced semiconductor wafer is formed in the singularization step by:

forming embrittled regions in the semiconductor wafer being held on the dicing tape, where the embrittled regions will serve to cleave the wafer into semiconductor chips; and subsequently expanding the dicing tape which holds the semiconductor wafer, to cleave the semiconductor wafer and the sinter-bonding sheet lying on the wafer.

13. The method for manufacturing a semiconductor device according to claim 9, wherein the picking-up step comprises picking up the semiconductor chips each with the sinter-bonding material layer from the dicing tape.

14. The method for manufacturing a semiconductor device according to claim 9, further comprising, before the picking-up step, the step of laminating a wafer processing tape onto the sinter-bonding material layer adhering to each of the semiconductor chips in the diced semiconductor wafer, where the sinter-bonding material layer is derived from the sinter-bonding sheet, and removing the dicing tape from the diced semiconductor wafer, wherein the picking-up step comprises picking up the semiconductor chips each with the sinter-bonding material layer from the wafer processing tape.

15. The method for manufacturing a semiconductor device according to claim 1, wherein the sintered layers each have a thickness of from 60% to 140% of an average thickness of the sintered layers.

16. The method for manufacturing a semiconductor device according to claim 1, wherein the sintered layers have an average thickness of 5 to 200 µm.

17. The method for manufacturing a semiconductor device according to claim 1, wherein the sinterable particles comprise at least one selected from the group consisting of silver, copper, silver oxide, and copper oxide.

18. The method for manufacturing a semiconductor device according to claim 1, wherein the semiconductor device is a power semiconductor device.

* * * * *